(12) United States Patent
Etori et al.

(10) Patent No.: US 8,629,431 B2
(45) Date of Patent: Jan. 14, 2014

(54) MATERIAL FOR PHOTOELECTRIC CONVERSION DEVICE AND PHOTOELECTRIC CONVERSION DEVICE

(75) Inventors: Hideki Etori, Sakura (JP); Hideyuki Murata, Sakura (JP); Norimasa Fukazawa, Sakura (JP); Shou Inagaki, Sakura (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/511,005

(22) PCT Filed: Oct. 12, 2010

(86) PCT No.: PCT/JP2010/067826
§ 371 (c)(1),
(2), (4) Date: Aug. 28, 2012

(87) PCT Pub. No.: WO2011/065133
PCT Pub. Date: Jun. 3, 2011

(65) Prior Publication Data
US 2012/0308822 A1    Dec. 6, 2012

(30) Foreign Application Priority Data

Nov. 26, 2009   (JP) ................................. 2009-268641

(51) Int. Cl.
*H01L 29/08* (2006.01)
*H01L 35/24* (2006.01)
*H01L 51/00* (2006.01)

(52) U.S. Cl.
USPC .............. 257/40; 977/734; 428/401; 136/263

(58) Field of Classification Search
None
See application file for complete search history.

(56) References Cited

U.S. PATENT DOCUMENTS 2,761,868 A    9/1956   Lacey

| 7,939,750 B2 | 5/2011 | Sohn et al. |
| 2005/0041458 A1* | 2/2005 | Lossau et al. ................. 365/151 |
| 2005/0138804 A1 | 6/2005 | Hasegawa et al. |
| 2007/0059928 A1 | 3/2007 | Harutyunyan |

FOREIGN PATENT DOCUMENTS

| JP | 2005-145896 A | 6/2005 |
| JP | 2006-143680 A | 6/2006 |
| JP | 2006-245073 A | 9/2006 |
| JP | 2007-005864 | 1/2007 |

(Continued)

OTHER PUBLICATIONS

Machine translation of JP 2009-280531 (which was provided by Applicant).*

(Continued)

*Primary Examiner* — Ling Choi
*Assistant Examiner* — Catherine S Branch
(74) *Attorney, Agent, or Firm* — Edwards Wildman Palmer LLP

(57) ABSTRACT

The present invention provides a photoelectric conversion device that is durable, lightweight, and inexpensive, and has a network structure of organic semiconductor nanowires that has high durability and is suitable for charge transport. In addition, to provide the photoelectric conversion device, the present invention provides, as an electron-donating material, a material for a photoelectric conversion device, the material including phthalocyanine nanowires having a breadth of 50 nm or less and a ratio (length/breadth) of a length to the breadth, the ratio being 10 or more. According to the present invention, a photoelectric conversion device having a long life due to high light resistance of phthalocyanine can be provided at a low cost. Use of such photoelectric conversion devices can constitute a solar-cell module having a long life due to the feature of the photoelectric conversion devices and being manufactured at a low cost.

20 Claims, 2 Drawing Sheets

(56) References Cited

FOREIGN PATENT DOCUMENTS

| | | | |
|---|---|---|---|
| JP | 2007005684 A * | 1/2007 | |
| JP | 2007-039561 A | 2/2007 | |
| JP | 2007-519636 A | 7/2007 | |
| JP | 2007-526881 A | 9/2007 | |
| JP | 2008-016834 A | 1/2008 | |
| JP | 2009-509037 A | 3/2009 | |
| JP | 2009-135237 A | 6/2009 | |
| JP | 2009-535841 | 10/2009 | |
| JP | 2009-280531 A | 12/2009 | |
| KR | 10-2008-0064438 A | 7/2008 | |
| WO | WO-03/076332 A1 | 9/2003 | |
| WO | WO-2007/037906 A2 | 4/2007 | |
| WO | WO-2007/130025 A1 | 11/2007 | |
| WO | WO-2010/122921 A1 | 10/2010 | |

OTHER PUBLICATIONS

Ligui Li et al., "Improving performance of polymer photovoltaic devices using an annealing-free approach via construction of ordered aggregates in solution," 1984 | J. Mater, Chem., 2008, 18, pp. 1984-1990.

H. Xin et al., "Bulk Heterojunction Solar Cells from Poly(3-butylthiophene)/Fullerene Blends: In Situ Self-Assembly of Nanowires, Morphology,Charge Transport, and Photovoltaic Properties," Cemistry of Materials, 2008, vol. 20, No. 19, pp. 6199-6207.

W. Y. Tong et al., "Synthesis and properties of copper phthalocyanine nanowires," Thin Solid Films, 2007, vol. 515, No. 13, pp. 5270-5274.

International Search Report dated Jan. 18, 2011, issued for PCT/JP2010/067826.

Office Action mailed May 7, 2013, issued for the Korean patent application No. 10-2011-7025886 and English translation thereof.

* cited by examiner

MATERIAL FOR PHOTOELECTRIC CONVERSION DEVICE AND PHOTOELECTRIC CONVERSION DEVICE

TECHNICAL FIELD

The present invention relates to a phthalocyanine-nanowire-containing material for a photoelectric conversion device and a photoelectric conversion device including the material for a photoelectric conversion device, the material being between a positive electrode and a negative electrode.

BACKGROUND ART

In contrast to silicon-based solar cells, which are mainly used, organic thin-film solar cells (thin-film organic photovoltaic cells) have huge potential because of, for example,
(1) low environmental load,
(2) low production cost, and
(3) lightweight and high durability,
and hence have been attracting attention in recent years. Such an organic thin-film solar cell is a photoelectric conversion device composed of organic materials, and, in such an organic thin-film solar cell, an organic semiconductor layer composed of an electron-donating π-conjugated polymer, such as a polythiophene polymer or a polyphenylenevinylene polymer, or an electron-donating low-molecular-weight material, such as a phthalocyanine, and an electron-accepting material such as a fullerene serves as a photoelectric-conversion active layer (photoelectric conversion layer). In particular, bulk heterojunction solar cells in which a nano-composite of an electron-donating material and an electron-accepting material is formed to increase the area of the interface between the materials that contributes to photoelectric conversion (this interface being hereinafter referred to as the DA junction) have been recently actively developed (Patent Literature 1).

The photoelectric-conversion principle of an organic thin-film solar cell is as follows:
(1) an organic semiconductor layer absorbs light to form excitons (pairs of holes and electrons),
(2) the excitons migrate by diffusion to the interface (DA junction) between an electron-donating material and an electron-accepting material,
(3) the excitons separate into charges of positive holes and electrons, and
(4) these charges are transported through the electron-donating material and the electron-accepting material to a positive electrode and a negative electrode to produce electric power. The product of the efficiencies of such steps governs the photoelectric conversion efficiency. The life of excitons is very short and a distance over which excitons can migrate by diffusion is very short: at most several nanometers to less than twenty nanometers.

Accordingly, to increase the photoelectric conversion efficiency, the DA junction of the organic semiconductor layer should be preferably present within a distance that substantially equals to the distance over which excitons can migrate by diffusion; and charge-transport paths along which charges after the charge separation can be rapidly transported to the electrodes are preferably ensured.

Unless the DA junction is distributed within the range of about several tens of nanometers in the organic semiconductor layer, there is a problem that excitons formed in the step (1) are deactivated before reaching the DA junction and charges are not extracted. Unless charge-transport paths of the electron-donating material and the electron-accepting material in the organic semiconductor layer are ensured, there is a problem that charges formed in the step (3) cannot reach the positive electrode or the negative electrode and an electromotive force is not obtained.

In view of the above-described points, to increase the efficiency of a photoelectric conversion device, an object is to form the DA junction within the exciton diffusion range and to ensure charge-transport paths formed of the electron-donating material and the electron-accepting material. Stated another way, an object is to form the network of the electron-donating material and the electron-accepting material in the organic semiconductor layer without isolation (formation of discontinuity) of these materials.

The most typical configuration of an organic photoelectric conversion device is bulk heterojunction in which an electron-donating material that is a π-conjugated polymer such as poly-3-hexylthiophene (hereafter, P3HT) and an electron-accepting material that is a fullerene derivative of [6,6]-phenyl-C61-butyric acid methyl ester (hereafter, PCBM) are mixed and the mixture is formed into a thin film so that DA junction are formed in the entire region of the film.

A photoelectric conversion device formed of an electron-donating π-conjugated polymer and PCBM is advantageous in that production thereof does not require expensive production equipment and can be achieved at a low cost because a film of these organic materials can be readily formed from a solution in which the organic materials are dissolved, by a printing method or a coating method (wet process). However, π-conjugated polymers generally have a problem of having a short life because, for example, they are susceptible to an oxidation reaction with oxygen in the air and have low resistance to strong light radiation. In addition, when such a DA junction formation method is used, there are cases where the networks of electron-donating and electron-accepting materials are not sufficiently formed and transport paths for charge transport are not ensured, which cause a decrease in the conversion efficiency.

In contrast, electron-donating low-molecular-weight materials such as phthalocyanines have high resistance to oxygen and light and are expected to provide solar cells having a long life. However, since the materials have a low molecular weight, it is difficult to form the networks (transport paths necessary for charge transport are less likely to be ensured) and it is also difficult to form films by wet processes. Accordingly, the films have been formed by vapor deposition methods, which incur high cost. However, in recent years, organic thin-film solar cells that contain an electron-donating low-molecular-weight material, and that are produced by a coating method have been proposed (Patent Literature 2), and, in the organic thin-film solar cells, a film is formed by a wet process using a solvent-soluble precursor and the film is heated to be turned into an electron-donating material. For example, photoelectric conversion devices in which an electron-donating material is a benzoporphyrin, an electron-accepting material is a fullerene such as PCBM, and a film thereof can be formed by a coating method are advantageous in that they have higher durability such as oxygen resistance and light resistance than conventional photoelectric conversion devices using electron-donating π-conjugated polymers.

However, in the case of using a solvent-soluble precursor, a heating operation requiring extra time and energy is necessary for heating a film of the precursor to convert the precursor into a functional material for a photoelectric conversion device, which is not necessarily preferable in terms of cost. In addition, as in the cases of using π-conjugated polymers, the network structure of the organic semiconductor layer is "accidentally" formed through phase separation caused by a heating treatment. Thus, isolated electron-donating and electron-accepting materials are indispensably present and hence charge-transport paths are not sufficiently ensured, which causes a decrease in the efficiency.

In recent years, to increase the charge-transport efficiency in the step (4) of the photoelectric-conversion principle, a photoelectric conversion device containing a nanowireshaped electron-donating material has been proposed (Non Patent Literature 1). Specifically, the shape of P3HT, which is an electron-donating π-conjugated polymer, is controlled to be nanowires, that is, fine wires having a width of about several tens of nanometers to increase the charge-transport efficiency. As a result, the P3HT/PCBM photoelectric conversion device containing P3HT nanowires has a higher photoelectric conversion efficiency than P3HT/PCBM photoelectric conversion devices without containing the nanowires.

Thus, it has been confirmed that photoelectric conversion devices containing polymeric nanowires have enhanced photoelectric conversion efficiency. However, as described above, polymers such as P3HT generally have low durability stemming from low oxygen resistance and low light resistance. Therefore, the problems of photoelectric conversion devices in view of practicality have not been overcome.

CITATION LIST

Patent Literature

PTL 1: Japanese Unexamined Patent Application Publication No. 2006-245073
PTL 2: Japanese Unexamined Patent Application Publication No. 2008-016834
Non Patent Literature 1: Journal of Materials Chemistry, 2008, vol. 18, p. 1984

SUMMARY OF INVENTION

Technical Problem

In view of the problems, the present invention has been accomplished. An object of the present invention is to provide a material for a photoelectric conversion device, the material providing, by a low-cost wet process, a network structure of nanowires suitable for charge transport and having high durability; and a photoelectric conversion device including the material.

Solution to Problem

The inventors of the present invention have performed thorough studies on how to achieve the object. As a result, the inventors have found that, by forming a phthalocyanine having high durability and serving as an electron-donating material into nanowires and dispersing the nanowires in a solvent, a photoelectric conversion device having a nanowire network structure can be provided by a wet process using the nanowires. Thus, the inventors have accomplished the present invention.

Specifically, the present invention provides a material for a photoelectric conversion device, the material containing phthalocyanine nanowires that serve as an electron-donating material and have a breadth of 50 nm or less and a ratio (length/breadth) of a length to the breadth, the ratio being 10 or more; and a photoelectric conversion device including the material.

Advantageous Effects of Invention

According to the present invention, since a film of a phthalocyanine-nanowire-containing material for a photoelectric conversion device can be formed by a wet process, a photoelectric conversion device that is durable, lightweight, and inexpensive can be formed on a flexible plastic substrate or the like. In addition, since phthalocyanines have high durability and nanowire structures have high charge transport property, a photoelectric conversion device that has a long life and a high conversion efficiency can be provided.

BEST MODES FOR CARRYING OUT THE INVENTION

Material for Photoelectric Conversion Device

Figure 1:
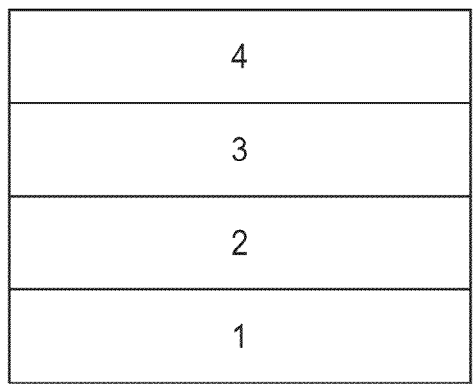
FIG. 1 is a schematic sectional view of a photoelectric conversion device according to the present invention.

A material for a photoelectric conversion device according to the present invention contains phthalocyanine nanowires having a breadth of 50 nm or less and a ratio (length/breadth) of a length to the breadth, the ratio being 10 or more. Hereinafter, phthalocyanine nanowires used in the present invention will be described.

An example of phthalocyanine nanowires having a breadth of 50 nm or less and a ratio (length/breadth) of a length to the breadth, the ratio being 10 or more, in the present invention is phthalocyanine nanowires composed of an unsubstituted phthalocyanine and a substituted phthalocyanine (phthalocyanine derivative).

Examples of an unsubstituted phthalocyanine forming phthalocyanine nanowires used in the present invention include publicly known and commonly used metal phthalocyanines having central metal atoms and metal-free phthalocyanines without central metal atoms. The central metal atoms are not limited as long as they allow formation of nanowires. Examples of the central metal atoms include a copper atom, a zinc atom, a cobalt atom, a nickel atom, a tin atom, a lead atom, a magnesium atom, a silicon atom, an iron atom, titanyl (TiO), vanadyl (VO), and aluminum chloride (AlCl). Of these, a copper atom, a zinc atom, and an iron atom are particularly preferred.

A substituted phthalocyanine (phthalocyanine derivative) forming phthalocyanine nanowires used in the present invention may be a phthalocyanine derivative represented by the following general formula (1) or (2).

[Chem. 1]

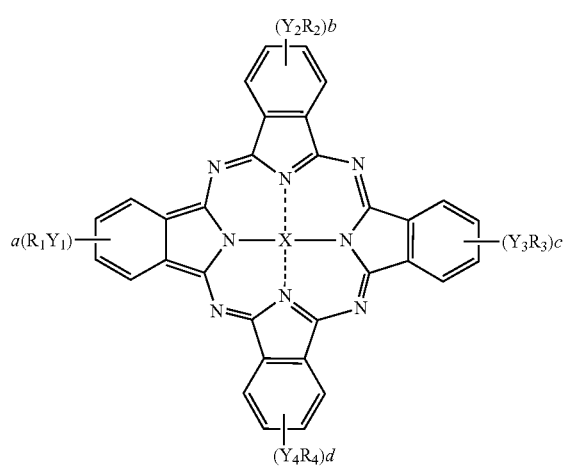

(1)

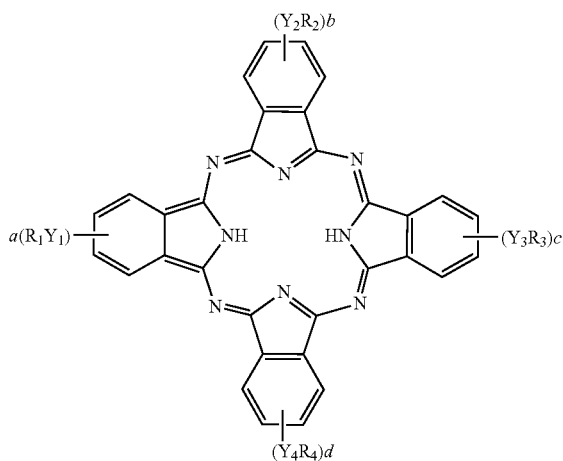

(2)

In the general formula (1) or (2), the metal atom X forming a complex with the phthalocyanine derivative is not particularly limited as long as it is publicly known and commonly used as a central metal of metal phthalocyanines; a preferred metal atom is any one selected from copper, zinc, cobalt, nickel, tin, lead, magnesium, silicon, and iron. As the X, titanyl (TiO), vanadyl (VO), or aluminum chloride (AlCl) may be used. As illustrated in the general formula (2), a phthalocyanine derivative that does not contain the central metal X may be used as the phthalocyanine derivative.

In the general formula (1) or (2), $Y_1$ to $Y_4$ represent bonding groups that bond the phthalocyanine skeleton to $R_1$ to $R_4$. When $Y_1$ to $Y_4$ serving as bonding groups are not present, $R_1$ to $R_4$ each represent $SO_3H$, $CO_2H$, an alkyl group that may optionally have a substituent, an (oligo)aryl group that may optionally have a substituent, an (oligo)heteroaryl group that may optionally have a substituent, a phthalimide group that may optionally have a substituent, or a fullerene that may optionally have a substituent.

In the general formula (1) or (2), $Y_1$ to $Y_4$ are not particularly limited as long as they represent bonding groups that bond the phthalocyanine ring to $R_1$ to $R_4$. Examples of the bonding groups include an alkylene group, an arylene group, a heteroarylene group, a vinylene bonding, ethinylene, a sulfide group, an ether group, a sulfoxide group, a sulfonyl group, a urea group, a urethane group, an amide group, an amino group, an imino group, a ketone group, and an ester group: specifically, —$(CH_2)_n$— (n represents an integer of 1 to 10), —CH=CH—, —C≡C—, —O—, —NH—, —S—, —S(O)—, and —$S(O)_2$—. Fullerenes may be used as bonding groups in the present invention. In the general formula (1) or (2), $R_1$ to $R_4$ are functional groups that can be bonded to the phthalocyanine ring through the bonding groups $Y_1$ to $Y_4$.

Specific examples of the functional groups include an alkyl group, an alkyloxy group, an amino group, a mercapto group, a carboxy group, a sulfonic group, a silyl group, a silanol group, a boronic group, a nitro group, a phosphate group, an aryl group, a heteroaryl group, a cycloalkyl group, a heterocycloalkyl group, a nitrile group, an isonitrile group, an ammonium salt, a fullerene, and a phthalimide group: specifically, an aryl group such as a phenyl group or a naphthyl group; a heteroaryl group such as an indoyl group or a pyridinyl group; and a methyl group. Of these, examples of specific preferred groups include $SO_3H$, $CO_2H$, an alkyl group that may optionally have a substituent, an alkyl group having an ether group or an amino group, an (oligo)aryl group that may optionally have a substituent, an (oligo)heteroaryl group that may optionally have a substituent, a phthalimide group that may optionally have a substituent, and a fullerene that may optionally have a substituent.

Examples of the alkyl group that may optionally have a substituent include alkyl groups having 1 to 20 carbon atoms. In particular, lower alkyl groups such as a methyl group, an ethyl group, and a propyl group are preferred. An alkyl group having an ether group or an amino group is also preferred and, for example, groups represented by the following formulae may be used.

[Chem. 2]

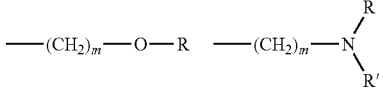

(where m represents an integer of 1 to 20; and R and R' each independently represent an alkyl group or an aryl group having 1 to 20 carbon atoms.)

Preferred examples of the (oligo)aryl group that may optionally have a substituent include a phenyl group that may optionally have a substituent, a naphthyl group that may optionally have a substituent, an oligophenylene group that may optionally have a substituent, and an oligonaphthyl group that may optionally have a substituent. Examples of such a substituent include publicly known general substituents with which aryl groups can be substituted.

Preferred examples of the (oligo)heteroaryl group that may optionally have a substituent include a pyrrole group that may optionally have a substituent, a thiophene group that may optionally have a substituent, an oligopyrrole group that may optionally have a substituent, and an oligothiophene group that may optionally have a substituent. Examples of such a substituent include publicly known general substituents with which heteroaryl groups can be substituted.

Examples of the fullerene that may optionally have a substituent include fullerenes and fullerenes having publicly known general substituents, such as C60 fullerene, C70 fullerene, and [6,6]-phenyl-C61-butyric acid methyl ester (PCBM).

The phthalimide group that may optionally have a substituent may be a group represented by the following formula.

[Chem. 3]

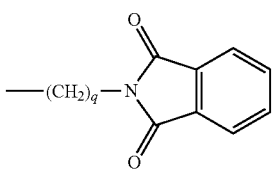

(where q represents an integer of 1 to 20.) Examples of the substituent include publicly known general substituents with which the phthalimide group can be substituted.

a, b, c, and d each independently represent an integer of 0 to 4 and the numbers of substituents $Y_4R_4$ to $Y_4R_4$ of the phthalocyanine ring. At least one of a to d representing the numbers of substituents of the phthalocyanine ring is not zero.

Non-limiting specific examples of a substituted phthalocyanine represented by the general formula (1) include phthalocyanines below. The numbers attached to the parentheses in the formulae of the substituted phthalocyanines represent the average number of the functional groups introduced per phthalocyanine molecule. Although the numbers of the substituents introduced into individual molecules are integers, molecules having different numbers of substituents introduced are actually used in combination.

[Chem. 4]
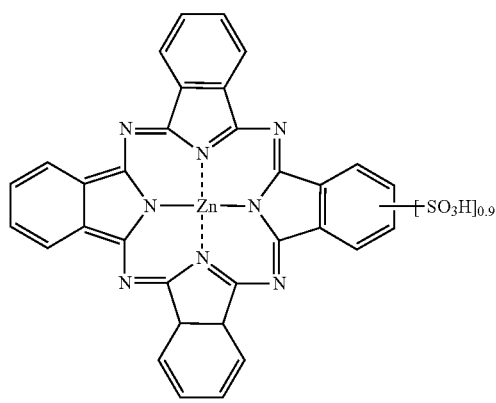
[Chem. 5]
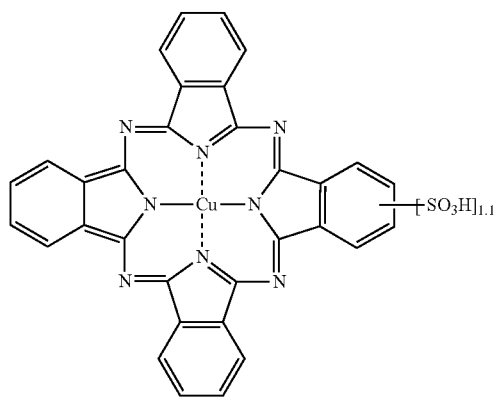
[Chem. 6]
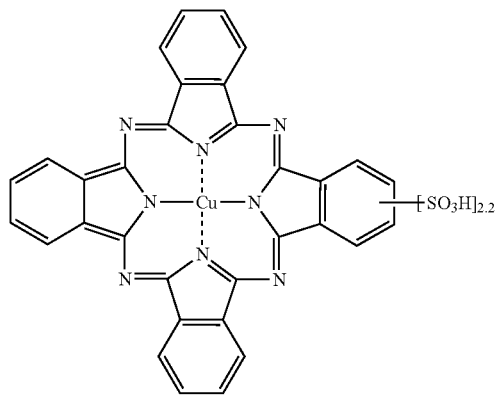
[Chem. 7]
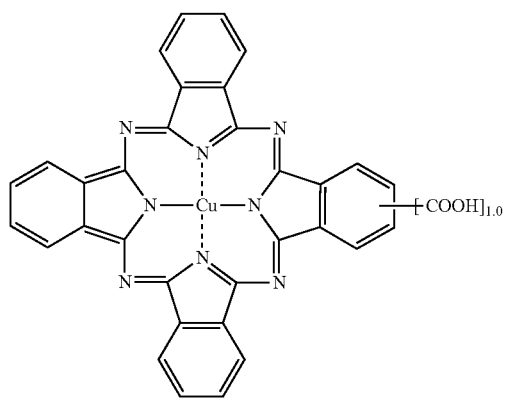
[Chem. 8]
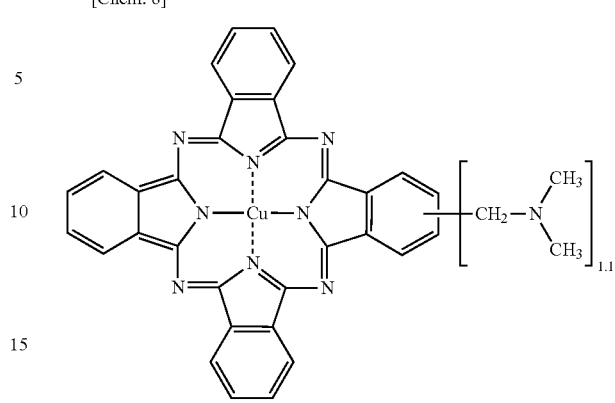
[Chem. 9]
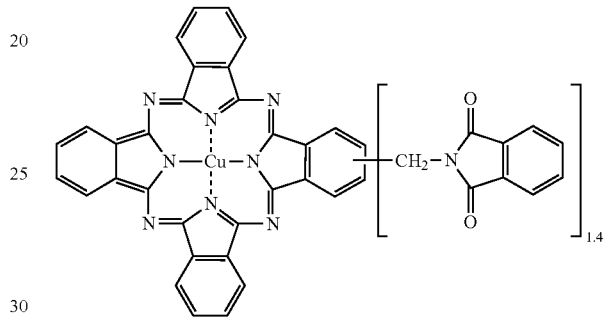
[Chem. 10]
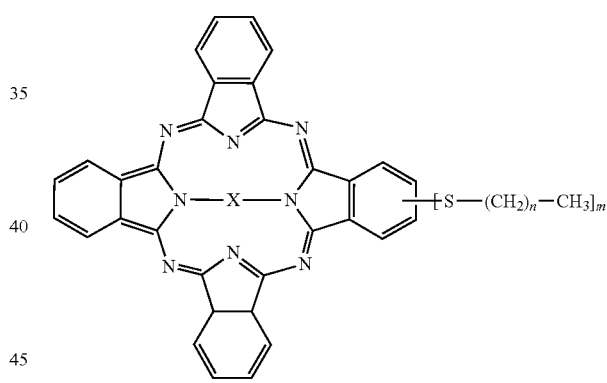
(where X represents a copper atom or a zinc atom; n represents an integer of 1 to 20; and m represents the average number of the functional group introduced and 0 to 4.)
[Chem. 11]
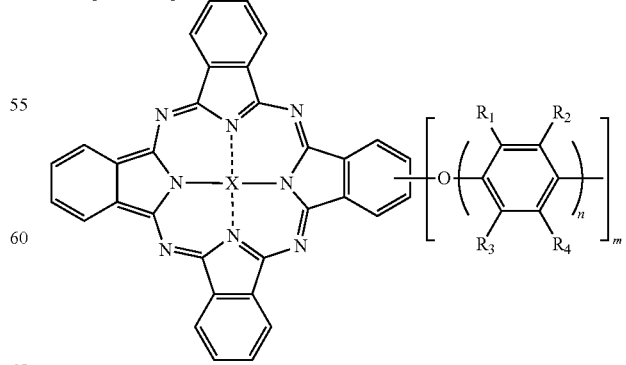
(where X represents a copper atom or a zinc atom; n represents an integer of 1 to 20; m represents the average number of the functional group introduced and 0 to 4; and $R_1$ to $R_4$ each independently represent a hydrogen atom, halogen, an alkyl group, an alkyloxy group, or an alkylthio group having 1 to 20 carbon atoms.)

[Chem. 12]

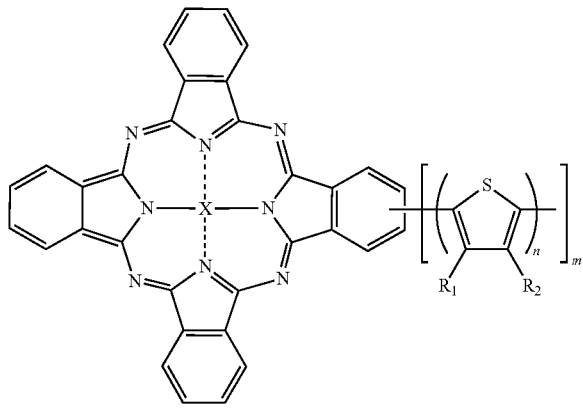

(where X represents a copper atom or a zinc atom; n represents an integer of 1 to 20; m represents the average number of the functional group introduced and 0 to 4; and $R_1$ and $R_2$ each independently represent a hydrogen atom, halogen, an alkyl group, an alkyloxy group, or an alkylthio group having 1 to 20 carbon atoms.)

Examples of specific compounds represented by the general formula (2) include phthalocyanine derivatives having no central metals in the formulae (4) to (12).

The phthalocyanine derivatives represented by the general formulae (1) and (2) can be synthesized by introducing side chains or functional groups into phthalocyanine rings. The sulfonated copper phthalocyanines described in [Chem. 4], [Chem. 5], and [Chem. 6] can be obtained by heating copper phthalocyanine in fuming sulfuric acid (concentration of sulfur trioxide: 20%). The compound in [Chem. 9] can be synthesized by, for example, the method disclosed in a patent literature (U.S. Pat. No. 2,761,868).

The above-described various phthalocyanine derivatives can be obtained by, for example, publicly known and commonly used methods for synthesizing phthalocyanines described in Japanese Unexamined Patent Application Publication Nos. 2005-145896 and 2007-39561. For example, various phthalonitrile compounds such as 4-phenoxy-phthalonitrile, 4-phenylthio-phthalonitrile, and 4-(1,3-benzothiazole-2-yl)-phthalonitrile are mixed with unsubstituted ortho-phthalonitrile in desired proportions and the mixture is heated in the presence of an organic base such as 1,8-diazabicyclo[5,4,0]undec-7-ene with metal salts such as copper (II) sulfate and zinc (II) chloride in ethylene glycol to thereby synthesize a phthalocyanine derivative having the various functional groups in desired proportions. The number of such a functional group in a phthalocyanine derivative synthesized with such a phthalonitrile compound serving as one of the starting materials can be freely changed by changing the mixing proportions of the phthalonitrile compound and ortho-phthalonitrile. For example, when a phthalocyanine derivative having a single functional group per phthalocyanine molecule on average is to be synthesized, the phthalonitrile derivative and ortho-phthalonitrile are mixed in a ratio of 1:3; in the case of introducing 1.5 functional groups on average, the synthesis is performed in a ratio of 3:5 by, for example, a method described in a patent literature. A phthalocyanine derivative having different functional groups may be synthesized from two or more phthalonitrile compounds and ortho-phthalonitrile.

Such phthalonitrile derivatives having a substituent include, in addition to those described above, publicly known and commonly used various phthalonitrile derivatives. Examples of such materials for synthesizing phthalocyanine derivatives usable in the present invention include [Chem. 2] in the paragraph [0001] of Japanese Unexamined Patent Application Publication No. 2007-519636; [Chem. 2] in the paragraph [0006] of Japanese Unexamined Patent Application Publication No. 2007-526881; phthalonitrile derivatives having oligothiophenes described in [Chem. 2] in the paragraph [0014] of Japanese Unexamined Patent Application Publication No. 2006-143680; and a phthalonitrile derivative having a fullerene in [Chem. 9] in the paragraph [0021] of Japanese Unexamined Patent Application Publication No. 2009-135237.

A phthalocyanine derivative that has a substituent and forms phthalocyanine nanowires used in the present invention may be a phthalocyanine derivative represented by the following general formula (3).

[Chem. 13]

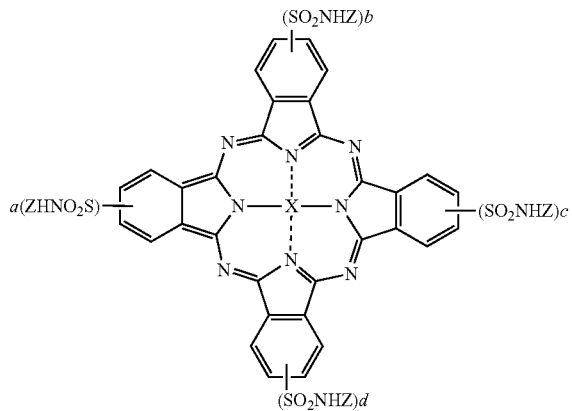

(where X represents any one selected from the group consisting of a copper atom, a zinc atom, a cobalt atom, a nickel atom, a tin atom, a lead atom, a magnesium atom, a silicon atom, an iron atom, titanyl (TiO), vanadyl (VO), and aluminum chloride (AlCl); Z represents a group represented by a formula (a) or (b) below; a, b, c, and d each independently represent an integer of 0 to 4 and at least one of a to d is not zero.)

[Chem. 14]

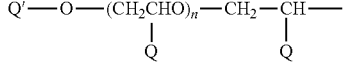

(where n represents an integer of 4 to 100; Q each independently represents a hydrogen atom or a methyl group; and Q' represents an acyclic hydrocarbon group having 1 to 30 carbon atoms.)

[Chem. 15]

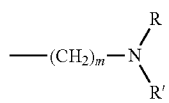

(where m represents an integer of 1 to 20; and R and R' each independently represent an alkyl group having 1 to 20 carbon atoms.)

The phthalocyanine derivative represented by the general formula (3) is a compound whose phthalocyanine ring has been substituted with one or more sulfamoyl groups. The number of sulfamoyl groups introduced per phthalocyanine ring is not particularly limited as long as it is at least one; preferably one or two sulfamoyl groups, more preferably one sulfamoyl group. The substitution positions are not particularly limited.

The most preferred compound as the chain compound Z in the present invention is a polyalkylene oxide copolymer represented by the general formula (a). Examples of this copolymer include all the polyalkylene oxides such as ethylene oxide polymer and ethylene oxide/propylene oxide copolymer; and the copolymer may be a block copolymer or a random copolymer.

Q', which represents an acyclic hydrocarbon group having 1 to 30 carbon atoms, may be a linear hydrocarbon group or a branched hydrocarbon group; and such a hydrocarbon group may be a saturated hydrocarbon group or an unsaturated hydrocarbon group. Examples of the acyclic hydrocarbon group include linear or branched saturated hydrocarbon groups such as a methyl group, an ethyl group, a n-propyl group, an isopropyl group, a π-butyl group, an isobutyl group, a π-pentyl group, a π-hexyl group, a π-octyl group, a 2-ethyl-hexyl group, a π-dodecyl group, a stearyl group, a π-tetracosyl group, and a π-triacontyl group.

As for the linear or branched unsaturated hydrocarbon group, the hydrocarbon group may have a double bond or a triple bond. Examples of the linear or branched unsaturated hydrocarbon group include a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, and a 2-pentene-4-ynyl group.

The number n of the polyalkylene oxide unit repeated is not particularly limited; in view of affinity for a dispersion medium, that is, the dispersion stability of the resultant nanowires, the number n is preferably 4 or more and 100 or less, more preferably 5 or more and 80 or less, still more preferably 10 or more and 50 or less.

A non-limiting example of a phthalocyanine derivative represented by the general formula (3) is a compound in a formula [Chem. 16].

[Chem. 16]

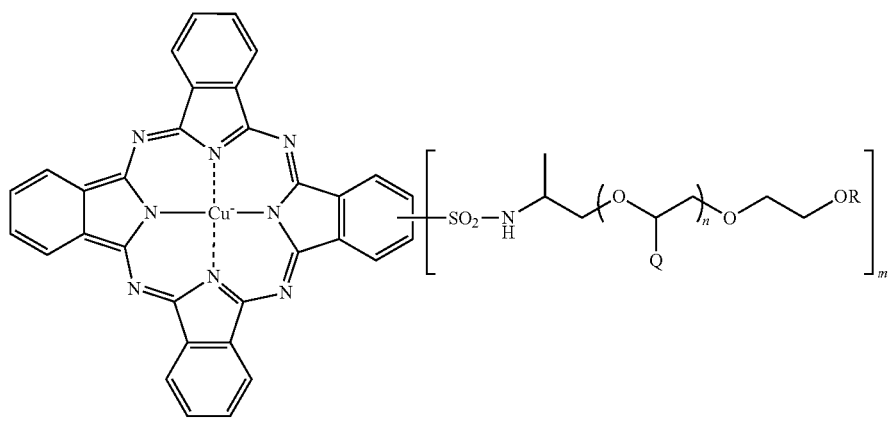

(where Q and R represent a hydrogen atom or a methyl group; n represents an integer of 4 to 100; and the introduction number m of the polyalkylene oxide chain bonded to the phthalocyanine through the sulfamoyl bonding represents the average introduction number of the functional group and 0 to 4 with respect to the four benzene rings of the phthalocyanine.)

Other than the phthalocyanine derivative, a phthalocyanine derivative represented by the general formula (3) may have a substituent Z represented by the general formula (b). Hereinafter, this derivative will be described in detail. The derivative can be obtained by the reaction between copper phthalocyanine sulfonyl chloride and an amine represented by the following formula.

[Chem. 17]

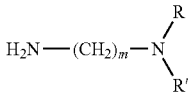

(where m represents an integer of 1 to 20; and R and R' each independently represent an alkyl group having 1 to 20 carbon atoms.)

Preferred examples of R and R' are lower alkyl groups, in particular, a methyl group. m preferably represents an integer of 1 to 6. A specific preferred phthalocyanine derivative is described below. The number attached to the parentheses in the formula of the substituted phthalocyanine represents the average number of the functional group introduced per phthalocyanine molecule. Although the numbers of the substituent introduced into individual molecules are integers, molecules having different numbers of the substituent introduced are actually used in combination.

[Chem. 18]

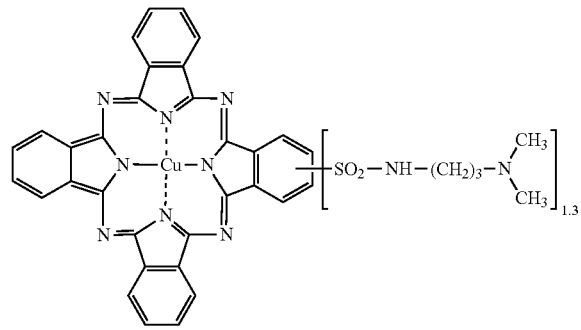

A phthalocyanine derivative represented by the general formula (3) can be produced by combined use of publicly known and commonly used methods: for example, the reaction between copper phthalocyanine sulfonyl chloride and a polyetheramine having an amine at an end of a polyether main chain (hereafter, abbreviated as "polyethermonoamine").

The copper phthalocyanine sulfonyl chloride serving as a starting material can be obtained by the reaction between copper phthalocyanine and chlorosulfonic acid or thionyl chloride. The polyethermonoamine serving as the starting other material can be obtained by a publicly known and commonly used method. For example, it can be obtained by reductive amination of a hydroxy group at an end of a polyether skeleton with a nickel/copper/chromium catalyst; or it can be obtained by imidization of a hydroxy group at an end of a polyether skeleton through Mitsunobu reaction (reference: Synthesis, 1981, P.1) and subsequent amination of the imide through hydrazine reduction (reference: Chemical Communications, 2003, P. 2062).

The polyethermonoamine is also commercially available: for example, JEFF AMINE M series (trade name, manufactured by Huntsman Corporation in the U.S.).

Hereinafter, methods (I) and (II) for producing phthalocyanine nanowires used in the present invention will be described.

<Production Method (I)>

The production method includes:

step (a) of dissolving an unsubstituted phthalocyanine and a substituted phthalocyanine (phthalocyanine derivative) in acid and subsequently precipitating the phthalocyanines in a poor solvent, to provide a composite, step (b) of forming the composite into fine particles, to provide composite fine particles, step (c) of dispersing the composite fine particles in an organic solvent, to provide a dispersion, and step (d) of forming nanowires using the dispersion.

Step (a)

It is generally known that phthalocyanines are soluble in acid solvents such as sulfuric acid. In a method for producing phthalocyanine nanowires in the present invention, the unsubstituted phthalocyanine and the substituted phthalocyanine are first dissolved in an acid solvent such as sulfuric acid, chlorosulfuric acid, methanesulfonic acid, or trifluoroacetic acid. The resultant solution is subsequently added to a poor solvent such as water to precipitate a composite of the unsubstituted phthalocyanine and the phthalocyanine derivative having a substituent.

The mixing percentage of the phthalocyanine derivative having a substituent with respect to the unsubstituted phthalocyanine is preferably in the range of 1 to 200 mass %, more preferably in the range of 1 to 120 mass %. When the mixing percentage is 1 mass % or more, the substituent (functional group or polymer side chain) of the substituted phthalocyanine sufficiently causes unidirectional crystal growth through steps described below, resulting in the formation of nanowires. When the mixing percentage is 200 mass % or less, since the amount of the functional group or the polymer side chain is not so large and crystal growth is not inhibited, nanowires are sufficiently formed through unidirectional crystal growth without the formation of an amorphous state or particles.

The amount of the unsubstituted phthalocyanine and the substituted phthalocyanine added to the acid solvent is not particularly limited as long as the phthalocyanines do not remain undissolved and are completely dissolved in the acid solvent. To keep the resultant solution to have such a viscosity that the solution has sufficient flowability, the concentration of the phthalocyanines in the solution is preferably 20 mass % or less.

When the solution in which the unsubstituted phthalocyanine and the substituted phthalocyanine have been dissolved is added to a poor solvent such as water to precipitate a composite of the unsubstituted phthalocyanine and the substituted phthalocyanine, the percentage of the solution with respect to the poor solvent is preferably in the range of 0.01 to 50 mass %. When the percentage is 0.01 mass % or more, the composite is precipitated at a sufficiently high concentration and hence the solid content is readily collected. When the percentage is 50 mass % or less, the entirety of the unsubstituted phthalocyanine and the substituted phthalocyanine is precipitated to form a solid composite. Thus, there are no dissolved components and therefore the phthalocyanines are readily collected.

The poor solvent is not particularly limited as long as it is a liquid in which the unsubstituted phthalocyanine and the substituted phthalocyanine are insoluble or slightly soluble. The most preferred poor solvents are water and an aqueous solution mainly containing water, since they can keep a high homogeneity of a precipitated composite, are suitable for the size reduction step described below, and have a low environmental load.

It has been confirmed that the composite of the unsubstituted phthalocyanine and the substituted phthalocyanine obtained in the step (a) has a homogeneous form without containing grain boundaries on the basis of an observation result with a transmission electron microscope.

The composite containing water can be collected through filtration with filter paper and a Buchner funnel in which the acidic solution is removed and rinsing is performed until the filtrate becomes neutral. The collected composite is dehydrated through dewatering and drying. Alternatively, when the collected composite is formed by a wet dispersion method into fine particles in the subsequent step, it may contain water.

Step (b)

The method for performing the step (b) is not particularly limited as long as the composite obtained in the step (a) can be formed into fine particles. The composite is preferably formed into fine particles by a wet dispersion method. For example, the composite obtained in the step (a) is subjected to wet dispersion with a wet dispersion apparatus using microbeads, such as a bead mill or a paint conditioner, or a medialess dispersion apparatus represented by T. K. FILMIX manufactured by PRIMIX Corporation, with a dispersion medium such as water, an organic solvent, or a water-containing organic solvent. Thus, the composite can be formed into fine particles. The mass percentage of the composite with respect to the dispersion medium is not particularly limited; in view of dispersion efficiency, the dispersion process s preferably performed such that the concentration of the solid content is in the range of 1 to 30 mass %. When micromedia such as zirconia beads are used in the dispersion process, the beads preferably have a size in the range of 0.01 to 2 mm in view of the degree to which the composite is formed into fine particles. The amount of micromedia used with respect to the dispersion of the composite is most preferably in the range of 100 to 1000 mass % in view of the efficiency of forming fine particles and collection efficiency.

When the formation of fine particles is performed in water, the resultant aqueous dispersion of composite fine particles is preferably dehydrated through dewatering and drying. The method of dewatering and drying is not particularly limited and may be filtration, centrifugal separation, or evaporation with a rotary evaporator or the like. After dewatering, drying may be further performed with a vacuum dryer or the like to completely remove water.

In the step (b), the water-containing composite from the step (a) may be completely dewatered through drying and the resultant composite may be subsequently subjected to wet dispersion in an organic solvent such as N-methylpyrrolidone, dichlorobenzene, or ethanol so that the composite is formed into fine particles to provide composite fine particles.

Step (c)

In the step (c), the composite fine particles obtained in the step (b) are dispersed in an organic solvent such as N-methylpyrrolidone. The organic solvent is not particularly limited unless it has a low affinity for phthalocyanines. For example, amide solvents and aromatic organic solvents that have a high affinity for phthalocyanines are preferred. Specifically, the most preferred organic solvents having a very high affinity for phthalocyanines are N,N-dimethylacetamide, N,N-dimethylformamide, N-methylpyrrolidone, toluene, xylene, ethylbenzene, chlorobenzene, and dichlorobenzene. The amide organic solvents and the aromatic organic solvents may be used alone. Alternatively, such an amide organic solvent and such an aromatic organic solvent may be mixed in desired proportions and may be further combined with another organic solvent.

Examples of such an organic solvent that can be combined with an amide organic solvent and an aromatic organic solvent include, in view of the capability of promoting formation of nanowires in the subsequent step, glycol esters such as ethylene glycol monomethyl ether acetate, propylene glycol monomethyl ether acetate, diethylene glycol monobutyl ether acetate, and diethylene glycol monoethyl ether acetate. Such an organic solvent may be added after composite fine particles are dispersed in an amide organic solvent and an aromatic organic solvent; alternatively, a mixture of such organic solvents is prepared in advance and composite fine particles may be added to and dispersed in the mixture.

As for the amount of an organic solvent added to the composite fine particles, in view of achieving an appropriate flowability and suppressing agglomeration, the solid content concentration of the composite fine particles with respect to the organic solvent is preferably in the range of 0.1% to 20%, more preferably in the range of 1% to 10%.

When composite fine particles are obtained by dispersion in water in the step (b), the composite fine particles dewatered by centrifugal separation or the like may be dispersed in such an organic solvent. Even when the dispersion contains water, nanowires can be obtained in the step described below.

Step (d)

The organic-solvent dispersion of the composite fine particles obtained by the step (c) is stirred (under heating) or left to stand (under heating) to produce nanowires. In this step, the temperature is preferably in the range of 5° C. to 250° C., more preferably in the range of 20° C. to 200° C. When the temperature is 5° C. or more, crystal growth of phthalocyanines can be sufficiently induced and nanowires can be grown through intended unidirectional crystal growth. When the temperature is 250° C. or less, agglomeration and fusion of nanowires scarcely occur and formation of coarse crystals due to crystal growth in the width direction does not occur. The time for which stirring or standing still is performed for the formation of nanowires is not particularly limited. To grow phthalocyanine nanowires to a length of 100 nm or more, stirring or standing still is preferably performed at least for 10 or more minutes.

By performing the steps (a) to (d), phthalocyanine nanowires having a width (breadth) of 50 nm or less and a wirelength ratio (length/breadth) of 10 or more can be produced.

The mechanism by which the composite of the unsubstituted phthalocyanine and the substituted phthalocyanine is formed through re-precipitation in the step (a) and, after the composite is formed into the composite fine particles in the step (b), the composite fine particles are formed into nanowires in the step (d) is not necessarily clear. However, the formation of nanowires is probably achieved in the following manner. The composite fine particles obtained in the step (b) have a particle size of 10 to 20 nm. In the step (d), the composite fine particles are connected to one another in a crystal plane direction of phthalocyanine to achieve unidirectional crystal growth. Thus, nanowires are formed. At this time, the organic solvent in the step (c) functions as a good dispersion medium for phthalocyanines and probably induces unidirectional crystal growth to further promote the formation of nanowires (possible mechanism 1).

Another possible mechanism is as follows. The unsubstituted phthalocyanine and the substituted phthalocyanine dissolve from the composite fine particles obtained in the step (b) and recrystallize on the composite surfaces to form nanowires. At this time, the composite surfaces have domains where a large amount of the unsubstituted phthalocyanine having a relatively low solubility remains. The domains have a size of several nanometers and hence crystals having a breadth of several nanometers are probably obtained (probable mechanism 2).

<Production Method (II)>

This production method has a feature of causing a reaction between an isoindoline compound and metal ions in a water-soluble polyhydric alcohol in the presence of a substituted phthalocyanine.

Specifically, in the production method, a substituted phthalocyanine, an isoindoline compound, and metal ions are dissolved in a water-soluble polyhydric alcohol and sufficiently stirred to provide a homogenous mixed solution.

When a temperature in the stirring is more than 80° C., there are cases where phthalocyanine crystals having a size beyond the level of nanometers are partially formed before mixing is sufficiently achieved or the yield becomes low. Accordingly, the stirring is preferably performed at 80° C. or less.

The polyhydric alcohol solution of the substituted phthalocyanine, the isoindoline compound, and a metal salt is mixed at a temperature of 80° C. or less to provide a mixed solution. This mixed solution is heated to 80° C. to 200° C. and 100° C. to 180° C. under stirring to cause the reaction between the isoindoline compound and the metal ions. Thus, a solid reaction product is obtained.

Alternatively, a polyhydric alcohol mixture of the isoindoline compound and a metal salt is dropped to a water-soluble polyhydric alcohol solution in which the substituted phthalocyanine has been dissolved. The resultant solution is set in the above-described temperature range to cause the reaction between the isoindoline compound and the metal ions. Thus, a solid reaction product can be obtained.

The mixing ratio of the isoindoline compound and the metal salt is preferably adjusted such that, in view of stoichiometry, the amount of the metal ions is 1 to 4 mol with respect to 4 mol of a phthalonitrile compound serving as a material.

Examples of a water-soluble polyhydric alcohol usable in the present invention include α-glycols such as ethylene glycol, propylene glycol, 1,2-butanediol, and 2,3-butanediol, and glycerin. In particular, water-soluble polyhydric alcohols having a molecular structure in which carbon atoms to which two or three hydroxy groups are bonded are next to each other are preferred.

Examples of a substituted phthalocyanine used in the present invention include compounds that have a phthalocyanine ring substituted with one or more sulfamoyl groups and have solubility in polyhydric alcohols: specifically, compounds represented by the general formula (3).

In the production method, Z in the general formula (3) is not particularly limited as long as it is a water-soluble polymer chain having a number-average molecular weight of 1000 or more; Z preferably represents a water-soluble polymer having a number-average molecular weight of 1000 or more and 10000 or less. Such a water-soluble polymer chain is not particularly limited as long as it has water solubility and an affinity for water-soluble polyhydric alcohols. Specifically, the water-soluble polymer chain may be a polymer residue having polyalkylene oxide as a moiety: more specifically, the polymer chain may have any polyalkylene oxide as a moiety such as ethylene oxide polymer or ethylene oxide/propylene oxide copolymer and it may be a block copolymer or a random copolymer. Preferably, Z is a polymer chain derived from an alkylene oxide copolymer (group) represented by the general formula [Chem. 14] (a) and the hydrophilicity and oleophilicity of the polymer chain are desirably optimized in accordance with solubility in a polyhydric alcohol used.

An isoindoline compound used in the present invention may be synthesized by a publicly known method. For example, a phthalonitrile compound such as ortho-phthalonitrile is dissolved in a polyhydric alcohol such as an α-glycol or glycerin by heating, and the reaction between the phthalonitrile compound and the polyhydric alcohol is made to occur in the presence of or absence of an organic base such as 1,8-diazabicyclo[5,4,0]undec-7-ene (hereafter, referred to as "DBU") or a metal alkoxide, to synthesize a reaction product of the phthalonitrile compound, soluble in a water-soluble polyhydric alcohol, and the polyhydric alcohol. On the basis of our study on the structure of the reaction product, we presume that the reaction product is an isoindoline compound. Accordingly, in the present invention, the reaction product is hereafter referred to as an isoindoline compound.

A phthalonitrile compound usable in the present invention is a compound having two —CN groups at the ortho position of a benzene ring or a naphthalene ring, such as ortho-phthalonitrile. For example, such a compound is represented by the following formula [Chem. 19].

[Chem. 19]

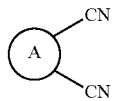

(where the ring A represents a benzene ring or a naphthalene ring that may optionally have a substituent: an alkyl group, an alkoxy group, an alkylthio group, or a halogen group). When the ring A represents a benzene ring, a halogen atom or a functional group such as an alkyl group may be introduced into another position of the ring A.

As for the temperature of the reaction between the phthalonitrile compound and the water-soluble polyhydric alcohol, in the case of not adding an organic base or a metal alkoxide, a temperature of 80° C. or more would be OK. However, a metal-free phthalocyanine compound is generated at a high temperature and, if so, a filtration step or the like becomes necessary, which is not preferable. When the temperature is low, the reaction may require a long time. Accordingly, practically, the reaction is preferably performed in the range of 100° C. to 130° C. for 15 minutes to 8 hours, more preferably for 1 to 3 hours. The resultant solution containing an isoindoline compound is preferably cooled to 80° C. or less immediately after the completion of the reaction so that the reaction does not further proceed. During the reaction, entry of water included in the air is preferably avoided by performing the reaction in a nitrogen atmosphere. The water-soluble polyhydric alcohol is preferably dewatered in advance.

When an organic base such as DBU is added and the reaction between the phthalonitrile compound and the polyhydric alcohol is performed, the reaction can be performed at a lower temperature than that in the case of not using the organic base, which is advantageous in suppressing generation of metal-free phthalocyanine compounds. Specifically, the reaction is preferably performed in the range of 30° C. to 100° C. for 10 minutes to 2 hours.

The mass percentage of the phthalonitrile compound with respect to the water-soluble polyhydric alcohol in the reaction is not particularly limited. However, when the concentration of the phthalonitrile compound is less than 2%, the productivity of synthesizing a metal phthalocyanine compound later becomes low. When the concentration is more than 40%, the resultant solution has very high viscosity and the amount of metal-free phthalocyanine compounds generated may become large. Accordingly, the concentration of the phthalonitrile compound is preferably in the range of 2 mass % to 40 mass %, in particular, in the range of 5 mass % to 20 mass %.

Examples of metal ions usable in the present invention include all the metal ions that can serve as the central metal of metal phthalocyanine: specifically, copper ions, zinc ions, cobalt ions, nickel ions, and iron ions. Such metal ions are generally supplied for the reaction by dissolving a metal salt in the water-soluble polyhydric alcohol. Examples of the salt include halides and sulfates. For example, in the case of copper salts, copper (II) chloride and copper (II) sulfate are preferred.

When the reaction between an isoindoline compound and metal ions is caused in the presence of a substituted phthalocyanine, a glycol solvent may be added to a water-soluble polyhydric alcohol solution containing these compounds and metal ions. In particular, the glycol solvent is preferably a glycol ester solvent in view of affinity for metal phthalocyanine nanowires generated and possible heating temperature.

Specifically, a non-limiting example is propylene glycol monomethyl ether acetate. The reason why glycol solvents are preferred is that they promote unidirectional crystal growth for forming nanowires of phthalocyanines according to the present invention.

The production method (I) is preferred between the above-described methods for producing phthalocyanine nanowires used in the present invention.

By dispersing the "phthalocyanine nanowires having a breadth of 50 nm or less and a ratio (length/breadth) of a length to the breadth, the ratio being 10 or more" in an organic solvent, the resultant dispersion can be used as a material (composition) for a photoelectric conversion device suitable for a wet process.

The type of the organic solvent is not particularly limited as long as the organic solvent allows stable dispersion of phthalocyanine nanowires therein. A single organic solvent or a mixture of two or more organic solvents may be used. In view of allowing for sufficient and stable dispersion of phthalocyanine nanowires, amide solvents are preferred: specifically, N,N-dimethylacetamide, N,N-dimethylformamide, N-methylpyrrolidone, and N,N-diethylformamide. Of these, N-methylpyrrolidone is particularly preferred.

The solvent forming a material for a photoelectric conversion device can be appropriately selected depending on the type of a substituted phthalocyanine contained in phthalocyanine nanowires. For example, preferred examples of an organic solvent in which phthalocyanine nanowires containing the derivative represented by [Chem. 9] can be sufficiently and stably dispersed include, in addition to amide solvents, aromatic solvents such as toluene, xylene, and ethylbenzene, and halogenated aromatic organic solvents such as chlorobenzene and dichlorobenzene.

Examples of halogenated organic solvents include chloroform, methylene chloride, and dichloroethane. Of these, particularly preferred is dichlorobenzene.

In a material for a photoelectric conversion device according to the present invention, to impart suitability for a wet process (printing or coating) or to perform good film formation, the content of phthalocyanine nanowires in the composition is preferably 0.05 to 20 mass %, in particular, preferably 0.1 to 10 mass %.

A material for a photoelectric conversion device according to the present invention may contain, in addition to phthalocyanine nanowires, another electron-donating material or a hole-transporting material. Examples of such materials include π-conjugated polymers such as polythiophenes, poly-p-phenylenevinylenes, poly-p-phenylenes, polyfluorenes, polypyrroles, polyanilines, polyacetylenes, and polythienylenevinylenes; non-π-conjugated polymers such as polyvinylcarbazole; and low-molecular-weight organic compounds such as soluble or solvent dispersible phthalocyanine derivatives and soluble or solvent dispersible porphyrin derivatives. Of these, the polymer materials also have the effect of imparting suitability for a wet process (printing or coating) and film-formation capability to a material for a photoelectric conversion device as described below.

An electron-accepting material represented by a fullerene may be added to a material for a photoelectric conversion device according to the present invention. As a result, a photoelectric conversion layer can be formed by one-time film formation. Examples of an electron-accepting material usable in the present invention include naphthalenes (e.g. 1,4,5,8-naphthalenetetracarboxylic diimide (NTCDI), N,N'-dialkyl-1,4,5,8-naphthalenetetracarboxylic diimide (NTCDI-R) (R represents an alkyl group having 1 to 20 carbon atoms), and 1,4,5,8-naphthalenetetracarboxylic dianhydride (NTCDA)); perylenes (e.g. 3,4,9,10-perylenetetracarboxylic dianhydride (PTCDA), 3,4,9,10-perylenetetracarboxylic bisbenzimidazole (PTCBI), 3,4,9,10-perylenetetracarboxylic diimide (PTCDI), and N,N'-dialkyl-3,4,9,10-perylenetetracarboxylic diimide (PTCDI-R) (R represents an alkyl group having 1 to 20 carbon atoms)); oxazole derivatives such as 2-(4-biphenylyl)-5-(4-t-butylphenyl)-1,3,4-oxadiazole (PBD) and 2,5-di(1-naphthyl)-1,3,4-oxadiazole (BND); triazole derivatives such as 3-(4-biphenylyl)-4-phenyl-5-(4-t-butylphenyl)-1,2,4-triazole (TAZ); phenanthroline derivatives; phosphine oxide derivatives; fullerenes (e.g. unsubstituted fullerenes such as C60, C70, C76, C78, C82, C84, C90, and C94; [6,6]-phenyl-C61-butyric acid methyl ester (PCBM), [5,6]-phenyl-C61-butyric acid methyl ester ([5,6]-PCBM), [6,6]-phenyl-C61-butyric acid hexyl ester ([6,6]-PCBH), [6,6]-phenyl-C61-butyric acid dodecyl ester ([6,6]-PCBD), phenyl-C71-butyric acid methyl ester (PC70BM), and phenyl-C85-butyric acid methyl ester (PC84BM)); carbon nanotubes (CNT); modified graphene; derivatives such as CN-PPV which is obtained by introducing cyano groups into poly-p-phenylenevinylene; Boramer (trade name, manufactured by TDA Research, Inc.); and publicly known and commonly used low- or high-molecular-weight organic semiconductor materials to which $CF_3$ groups or F groups have been introduced. Of these, fullerene compounds, which have a high charge separation rate and a high electron transfer rate, are preferably used. Among fullerene compounds, PCBM and C70 derivatives (the above-described PC70BM and the like) are more preferred because they are excellent in charge separation rate and electron transfer rate and higher photoelectric conversion efficiency can be achieved.

Among the electron-accepting materials, polymer materials (electron-accepting polymers) such as Boramer (trade name, manufactured by TDA Research, Inc.) and derivatives obtained by introducing cyano groups into poly-p-phenylenevinylene (CN-PPV) are preferred because they have, in addition to a semiconducting function of charge separation and electron transfer, the effect of imparting suitability for a wet process (printing or coating) and film-formation capability to the material for a photoelectric conversion device.

In a material for a photoelectric conversion device according to the present invention, the mixing ratio of phthalocyanine nanowires to an electron-accepting material can be freely selected as long as a photoelectric conversion device described below has photoelectric conversion characteristics; however, the phthalocyanine nanowires/electron-accepting material is preferably in the range of 1/99 to 99/1, more preferably in the range of 1/9 to 9/1, and still more preferably in the range of 2/8 to 8/2.

In a material for a photoelectric conversion device according to the present invention, when an electron-accepting material is added, the total content of the phthalocyanine nanowires and the electron-accepting material with respect to the solvent is preferably 0.05 to 20 mass %, particularly preferably 0.1 to 10 mass %.

To impart suitability for a wet process (printing or coating) and film-formation capability (film quality after printing or coating) to a material for a photoelectric conversion device according to the present invention, a resin component can be added as a rheological control component or a binder component to the material for a photoelectric conversion device. The resin is not particularly limited as long as it is a publicly known and commonly used resin. A single resin or two or more resins in combination may be used. Preferred examples of such resins include polymethyl methacrylate, polystyrene, and polycarbonate.

When the content of such a resin is excessively high, the viscosity of the ink excessively increases, which influences printability and film-formation capability when coating. Also, since polymethyl methacrylate, polystyrene, polycarbonate, and the like are electrically inactive, an excessively high content of such a resin results in a relative decrease in the concentrations of the electron-donating material and the electron-accepting material. Thus, the photoelectric conversion characteristics exhibited by these materials are degraded. Accordingly, the content of a resin in the ink composition is preferably 20 mass % or less, more preferably 10 mass % or less.

In a material for a photoelectric conversion device according to the present invention, a constitutional component and various surfactants and the like may be optionally added for the purpose of mainly adjusting the surface tension of the ink and enhancing leveling properties.

The constitutional component may be a publicly known and commonly used single fine powder that can maintain photoelectric conversion characteristics; or at least one pigment dispersion obtained by dispersing such single fine powder in a dispersing agent or an organic solvent in advance. Non-limiting specific examples include AEROSIL series (trade name, manufactured by Evonik Industries); Sylysia, Sylophobic, Sylopute, Sylopage, Sylopure, Sylosphere, Sylomask, Silwell, and Fuji Balloon (trade names, manufactured by FUJI SILYSIA CHEMICAL LTD.); PMA-ST and IPA-ST (trade names, manufactured by Nissan Chemical Industries, Ltd.); and NANOBIC 3600 series and NANOBIC 3800 series (trade names, manufactured by BYK Japan KK). These examples may be used alone or in combination of two or more thereof. Since a photoelectric conversion device is configured to transport charge in the film thickness direction, the film needs to have surface smoothness. Accordingly, a constitutional component added to the ink preferably has an average particle size of 1 to 150 nm, more preferably 5 to 50 nm, preferably PMA-ST and IPA-ST (trade names, manufactured by Nissan Chemical Industries, Ltd.) and NANOBIC 3600 series (trade name, manufactured by BYK Japan KK), which are silica fine particle dispersions and alumina dispersions. The volume-average particle size can be readily measured by, for example, a dynamic light scattering method. Since such constitutional component are electrically inactive, an excessively high content of such a constitutional component results in a decrease in the concentrations of the electron-donating material and the electron-accepting material. Thus, the photoelectric conversion characteristics exhibited by these materials are degraded. Accordingly, the content of a constitutional component with respect to the entire solid content of a material for a photoelectric conversion device is 90 mass % or less, preferably 70 mass % or less.

As a surfactant, a hydrocarbon-based surfactant, a silicon-based surfactant, a fluorine-based surfactant, or a mixture of two or more of these surfactants may be used. In particular, preferred are fluorine-based surfactants having a linear perfluoroalkyl group and a chain length corresponding to 6 or more carbon atoms; more preferably, nonionic fluorine-based surfactants having a chain length corresponding to 8 or more carbon atoms. Non-limiting examples include MEGAFACE F-482, MEGAFACE F-470 (R-08), MEGAFACE F-472SF, MEGAFACE R-30, MEGAFACE F-484, MEGAFACE F-486, MEGAFACE F-172D, and MEGAFACE F178RM (trade names, manufactured by DIC Corporation). These surfactants may be used alone or in combination of two or more thereof. The content of such a surfactant in a material for a photoelectric conversion device is 5.0 mass % or less in terms of active component, preferably 1.0 mass % or less in terms of active component.

In a material for a photoelectric conversion device according to the present invention, the above-described materials are mixed. The mixing method is not particularly limited. For example, the above-described materials in desired proportions are added to a solvent and the materials are subsequently mixed with the solvent by one or more methods selected from heating, stirring, ultrasonic radiation, and the like.

(Photoelectric Conversion Device)

Hereinafter, a photoelectric conversion device according to the present invention will be described. A photoelectric conversion device according to the present invention at least includes a pair of electrodes, that is, a positive electrode and a negative electrode, and a film that is formed of a material for a photoelectric conversion device according to the present invention and is disposed between the electrodes. FIG. 1 is a schematic view of an embodiment of a photoelectric conversion device according to the present invention. In FIG. 1, the reference sign 1 denotes a substrate; the reference sign 2 denotes an electrode a; the reference sign 3 denotes a photoelectric conversion layer (organic semiconductor layer) containing a material for a photoelectric conversion device according to the present invention; and the reference sign 4 denotes an electrode b.

The organic semiconductor layer 3 is a film containing a material for a photoelectric conversion device according to the present invention, that is, the film contains "phthalocyanine nanowires having a breadth of 50 nm or less and a ratio (length/breadth) of a length to the breadth, the ratio being 10 or more".

Figure 2:
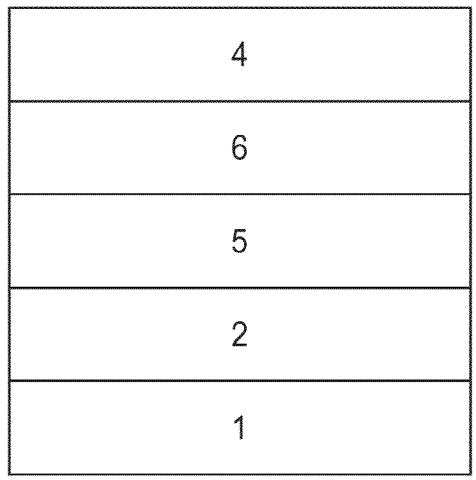
FIG. 2 is a schematic sectional view of a photoelectric conversion device according to the present invention.

When the organic semiconductor layer 3 contains an electron-accepting material, the "phthalocyanine nanowires having a breadth of 50 nm or less and a ratio (length/breadth) of a length to the breadth, the ratio being 10 or more" and the electron-accepting material may be mixed or form a multilayer structure. An example of the multilayer structure is illustrated in FIG. 2. A layer containing "a material for a photoelectric conversion device, containing phthalocyanine nanowires having a breadth of 50 nm or less and a ratio (length/breadth) of a length to the breadth, the ratio being 10 or more" serving as an electron-donating material is preferably positioned so as to be close to the positive electrode and a layer containing the electron-accepting material is preferably positioned so as to be close to the negative electrode. Thus, in FIG. 2, when the reference sign 5 denotes the layer containing "a material for a photoelectric conversion device, containing phthalocyanine nanowires having a breadth of 50 nm or less and a ratio (length/breadth) of a length to the breadth, the ratio being 10 or more" and the reference sign 6 denotes the layer containing the electron-accepting material, the electrode a denoted by the reference sign 2 is the positive electrode and the electrode b denoted by the reference sign 4 is the negative electrode. Note that, in the case of the multilayer structure, "an electron-donating material other than the phthalocyanine nanowires" may be contained in the layer containing the "phthalocyanine nanowires having a breadth of 50 nm or less and a ratio (length/breadth) of a length to the breadth, the ratio being 10 or more" (reference sign 5) or the layer containing the electron-accepting material (reference sign 6).

The thickness of the organic semiconductor layer (reference sign 3 in FIG. 1; and reference signs 5 and 6 in FIG. 2) is not particularly limited as long as, in the organic semiconductor layer, light absorption is sufficiently achieved and charge deactivation does not occur. The thickness is preferably in the range of 5 to 1000 nm, more preferably in the range of 10 to 500 nm, still more preferably in the range of 20 to 300 nm. In the case of the multilayer structure, within the above thickness, a layer containing "phthalocyanine nanowires having a breadth of 50 nm or less and a ratio (length/breadth) of a length to the breadth, the ratio being 10 or more" according to the present invention preferably has a thickness of 1 to 500 nm, more preferably 15 to 300 nm.

The organic semiconductor layer can be obtained by forming a film of a material for a photoelectric conversion device according to the present invention by a wet process (printing or coating) and drying the film. A method for forming a film of a material for a photoelectric conversion device according to the present invention is not particularly limited and may be a publicly known and commonly used method. Specific examples of the method include an ink jet printing method, a gravure printing method, a gravure offset printing method, an offset printing method, a relief printing method, a letter press reverse printing method, a screen printing method, a micro contact printing method, a reverse method, an air doctor coater method, a blade coater method, an air knife coater method, a roll coater method, a squeeze coater method, an impregnated coater method, a transfer roll coater method, a kiss coater method, a cast coater method, a spray coater method, an electrostatic coater method, an ultrasonic spray coater method, a die coater method, a spin coater method, a bar coater method, a slit coater method, and a drop cast method.

When the organic semiconductor layer is formed so as to have a multilayer structure as illustrated in FIG. 2, a film of a material for a photoelectric conversion device containing the "phthalocyanine nanowires having a breadth of 50 nm or less and a ratio (length/breadth) of a length to the breadth, the ratio being 10 or more" according to the present invention is formed by such a method described above and a film of an electron-accepting material may be subsequently formed thereon by a publicly known and commonly used method as in the film formation of a buffer layer described below. Note that "phthalocyanine nanowires having a breadth of 50 nm or less and a ratio (length/breadth) of a length to the breadth, the ratio being 10 or more" in the formed film gain solvent resistance and hence the electron-accepting material can be formed thereon by a wet process.

Examples of the material of the substrate 1 include silicon, glass, and various resin materials. Examples of the various resin materials include polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), cellulose acetate propionate (CAP), and acrylic resins. In this way, by using a resin material, lightweight, high portability, and high impact resistance can be achieved, compared with the cases of using glass.

In the case of irradiation with light from the substrate side, a material having a high light transmittance is preferred. Examples of such a material include glass, PET, PC, polyimide, PES, and acrylic resins.

As for materials for the electrodes a and b, a conductive material having a high work function is preferably used for one of the electrodes and a conductive material having a low work function is preferably used for another one of the electrodes. The electrode formed of a conductive material having a high work function serves as a positive electrode. Preferred examples of the conductive material having a high work function include metals such as gold, platinum, chromium, and nickel; transparent oxides of metals such as indium and tin; transparent composite oxides of metals such as indium and tin (indium tin oxide (ITO), indium zinc oxide (IZO), fluorine-doped tin oxide (FTO)); (multilayer) graphene; (multilayer) modified graphene; and publicly known conductive polymers whose conductivity has been increased by doping, examples of which are conductive polyaniline, conductive polypyrrole, conductive polythiophene, and conductive polyethylene dioxythiophene (PEDOT). A conductive material used for the positive electrode is preferably a material that forms ohmic contact with the organic semiconductor layer 3. When a buffer layer 1 is used as described below, a conductive material used for the positive electrode is preferably a material that forms ohmic contact with the buffer layer 1.

The electrode formed of a conductive material having a low work function serves as a negative electrode. Examples of such a conductive material having a low work function include alkali metals and alkaline-earth metals: specifically, lithium, magnesium, and calcium. The examples further include tin, silver, and aluminum, which are preferably used. An electrode formed of an alloy of such metals or constituted by a stack of layers formed of such metals is preferably used. A conductive material used for the negative electrode is preferably a material that forms ohmic contact with the organic semiconductor layer 3. When a buffer layer 2 is used as described below, a conductive material used for the negative electrode is preferably a material that forms ohmic contact with the buffer layer 2.

In a photoelectric conversion device according to the present invention, one of the electrodes a and b preferably has optical transparency. The optical transparency of such an electrode is not particularly limited as long as it allows incident light to reach the organic semiconductor layer 3 to generate an electromotive force. Preferred examples of such a conductive material include ITO (indium oxide-tin oxide composite); FTO (fluorine-doped tin oxide); (multilayer) graphene; (multilayer) modified graphene; and publicly known conductive polymers whose conductivity has been increased by doping, examples of which are conductive polyaniline, conductive polypyrrole, conductive polythiophene, and conductive polyethylene dioxythiophene (PEDOT). Such a material may be combined with a mesh formed of a metal material having a high conductivity.

The thickness of an electrode should be in a range in which the electrode has optical transparency and conductivity. The thickness varies depending on electrode materials, and it is preferably 5 to 10000 nm, preferably 10 to 5000 nm, still more preferably 20 to 300 nm. As for the other electrode, conductivity is required, optical transparency is not necessarily indispensable and the thickness is not particularly limited.

Examples of a method for forming an electrode with such a material serving as a raw material include: a method in which an electrode is formed through a pattern mask by a process such as vapor deposition or sputtering; a method in which a conductive "solid" film formed by a process such as vapor deposition or sputtering is formed into an electrode by a publicly known photolithographic process or liftoff process; and a method in which a conductive thin film formed by a process such as vapor deposition or sputtering is etched through resist formed with an ink jet or the like. A pattern formed of a conductive fine particle dispersion, a conductive polymer solution, or a conductive polymer dispersion may be directly formed by an ink jet printing method, a screen printing method, a gravure offset printing method, a letter press reverse printing method, or a micro contact printing method. Alternatively, a "solid" coating film may be patterned by lithography, laser ablation, or the like.

In the present invention, the buffer layer 1 may be formed between the positive electrode and the organic semiconductor layer 3. The buffer layer 1 is optionally used for allowing efficient charge extraction. Preferred examples of a material for forming the buffer layer 1 include graphene oxide; modified graphene; hole-transporting polymers such as polythiophenes, poly-p-phenylenevinylenes, polyfluorenes, and polyvinylcarbazole; and hole-transporting low-molecular-weight organic compounds such as phthalocyanine derivatives (H2Pc, CuPc, ZnPc, and the like) and porphyrin derivatives. Such materials may be doped to increase conductivity (hole-transporting property). In particular, polyethylene dioxythiophene (PEDOT), which is a polythiophene, and PEDOT:PSS obtained by doping PEDOT with polystyrene sulfonate (PSS) are preferably used. The buffer layer 1 preferably has a thickness of 5 to 600 nm, more preferably 10 to 200 nm.

In the present invention, the buffer layer 2 may be formed between the organic semiconductor layer 3 and the negative electrode. The buffer layer 2 is optionally used for allowing efficient charge extraction. Examples of a material for forming the buffer layer 2 include: in addition to the above-described electron-accepting materials (naphthalenes (e.g. 1,4,5,8-naphthalenetetracarboxylic diimide (NTCDI), N,N'-dialkyl-1,4,5,8-naphthalenetetracarboxylic diimide (NTCDI-R) (R represents an alkyl group having 1 to 20 carbon atoms), and 1,4,5,8-naphthalenetetracarboxylic dianhydride (NTCDA)); perylenes (e.g. 3,4,9,10-perylenetetracarboxylic dianhydride (PTCDA), 3,4,9,10-perylenetetracarboxylic bisbenzimidazole (PTCBI), 3,4,9,10-perylenetetracarboxylic diimide (PTCDI), and N,N'-dialkyl-3,4,9,10-perylenetetracarboxylic diimide (PTCDI-R) (R represents an alkyl group having 1 to 20 carbon atoms)); oxazole derivatives such as 2-(4-biphenylyl)-5-(4-t-butylphenyl)-1,3,4-oxadiazole (PBD) and 2,5-di(1-naphthyl)-1,3,4-oxadiazole (BND); triazole derivatives such as 3-(4-biphenylyl)-4-phenyl-5-(4-t-butylphenyl)-1,2,4-triazole (TAZ); phenanthroline derivatives; phosphine oxide derivatives; fullerenes (e.g. unsubstituted fullerenes such as C60, C70, C76, C78, C82, C84, C90, and C94; [6,6]-phenyl-C61-butyric acid methyl ester (PCBM), [5,6]-phenyl-C61-butyric acid methyl ester ([5,6]-PCBM), [6,6]-phenyl-C61-butyric acid hexyl ester ([6,6]-PCBH), [6,6]-phenyl-C61-butyric acid dodecyl ester ([6,6]-PCBD), phenyl-C71-butyric acid methyl ester (PC70BM), and phenyl-C85-butyric acid methyl ester (PC84BM)); carbon nanotubes (CNT); modified graphene; derivatives obtained by introducing cyano groups into poly-p-phenylenevinylene (the derivatives being referred as CN-PPV); Boramer (trade name, manufactured by TDA Research, Inc.); and publicly known and commonly used low- or high-molecular-weight organic semiconductor materials to which $CF_3$ groups or F groups have been introduced); octaazaporphyrin; perfluoro compounds such as perfluoropentacene and perfluorophthalocyanine; charge-transfer complexes composed of an electron-donating compound such as bathocuproin (BCP), bathophenanthroline (Bphen), tetrathiafulvalene, or tetramethylphenylenediamine and an electron-accepting compound such as tetracyanoquinodimethane or tetracyanoethylene; n-type inorganic oxide semiconductors such as titanium oxide, zinc oxide, and gallium oxide; and alkali metal compounds such as lithium fluoride, sodium fluoride, and cesium fluoride. The buffer layer 2 preferably has a thickness of 0.5 to 600 nm, more preferably 1 to 200 nm.

Examples of a method for forming such buffer layers include dry processes such as a vacuum deposition method, a molecular beam epitaxy method, an ion cluster beam method, a low-energy ion beam method, an ion plating method, a CVD method, a sputtering method, and an atmospheric-pressure plasma method; and wet processes such as an ink jet printing method, a gravure printing method, a gravure offset printing method, an offset printing method, a relief printing method, a letter press reverse printing method, a screen printing method, a micro contact printing method, a reverse method, an air doctor coater method, a blade coater method, an air knife coater method, a roll coater method, a squeeze coater method, an impregnated coater method, a transfer roll coater method, a kiss coater method, a cast coater method, a spray coater method, an electrostatic coater method, an ultrasonic spray coater method, a die coater method, a spin coater method, a bar coater method, a slit coater method, and a drop cast method. Such a method can be appropriately used in accordance with a material.

When an inorganic oxide is used to form a buffer layer, the following wet process may be used: a method in which fine particles of an inorganic oxide are dispersed in a desired organic solvent or water optionally with a dispersing auxiliary such as a surfactant to provide a dispersion and the dispersion is applied and dried; or the so-called sol-gel process in which a solution of an oxide precursor such as an alkoxide is applied and dried.

Such a buffer layer may be constituted by a single layer or a multilayer in which layers formed of different materials are laminated.

Photoelectric conversion devices according to the present invention may be integrated to constitute a solar-cell module. In this case, photoelectric conversion devices according to the present invention may be made to have a configuration in which the photoelectric conversion devices are shielded from the water-containing air with a protective sheet or an adhesive sealing material. An example of a solar-cell module has a configuration in which photoelectric conversion devices according to the present invention are integrated in series: the electrode a of a photoelectric conversion device according to the present invention and the electrode b of a neighboring photoelectric conversion device according to the present invention are brought into contact with each other to achieve series connection of the photoelectric conversion devices according to the present invention.

Another example of a solar-cell module has a configuration in which photoelectric conversion devices according to the present invention are integrated through parallel connection: the electrodes a of neighboring photoelectric conversion devices according to the present invention are brought into contact with each other and the electrodes b of neighboring photoelectric conversion devices according to the present invention are brought into contact with each other.

EXAMPLES

Hereinafter, the present invention will be specifically described with reference to Examples. However, the present invention is not limited to the following Examples.

Example 1

Production of Photoelectric Conversion Device Material

Step (a) (Re-Precipitation Step)
A concentrated sulfuric acid solution was prepared by adding and completely dissolving 1.67 g of copper phthalocyanine (Fastogen Blue 5380E, manufactured by DIC Corporation) and 0.83 g of a derivative represented by [Chem. 9], which is a substituted phthalocyanine, in 81 g of concentrated sulfuric acid (manufactured by KANTO CHEMICAL CO., INC.). Subsequently, 730 g of distilled water was poured into a 1000-mL beaker and sufficiently cooled with ice water. The prepared concentrated sulfuric acid solution was then added to the distilled water under stirring to precipitate a composite of copper phthalocyanine and the copper phthalocyanine derivative represented by [Chem. 9].

The obtained composite was then collected in the form of a water-containing composite by filtration through filter paper and sufficient rinsing with distilled water. The weight of the water-containing composite was measured and found to be 12.4 g.

Step (b) (Fine-Particle Formation Step)

The water-containing composite (12.4 g) obtained in the step (a) and containing 2.5 g of the composite of copper phthalocyanine and the copper phthalocyanine derivative represented by [Chem. 9] was placed in a polypropylene vessel having a volume of 50 mL. In this vessel, 4.3 g of distilled water was added such that the weight percentage of the composite with respect to water was 15%; and 60 g of zirconia beads having a size of 0.5 mm were added. The resultant solution was treated with a paint shaker for 2 hours to disperse the composite as fine particles. The composite having the form of fine particles was subsequently separated and collected from the zirconia beads and subjected to filtration to provide composite fine particles.

Step (c) (Step of Dispersion in Organic Solvent)

The composite fine particles obtained in the step (b) were dispersed in 60 g of ortho-dichlorobenzene. This dispersion was stirred for 2 hours and then mixed with 60 g of N-methylpyrrolidone. This mixture was further stirred for 2 hours.

Step (d) (Nanowire Formation Step)

The dispersion obtained in the step (c) was heated with an oil bath to 145° C. over 90 minutes. After the dispersion reached 145° C., it was heated for 30 minutes at the same temperature.

The heated dispersion was filtrated through a membrane filter (pore size: 0.1 µm) and the filtration residue was sufficiently washed with ortho-dichlorobenzene. The filtration residue was added to ortho-dichlorobenzene such that the solid content concentration was 2%. This solution was sufficiently shaken to provide an ortho-dichlorobenzene dispersion (1) containing copper phthalocyanine nanowires. The dispersion was very stable and precipitation of the phthalocyanine nanowires was not observed.

Figure 3:
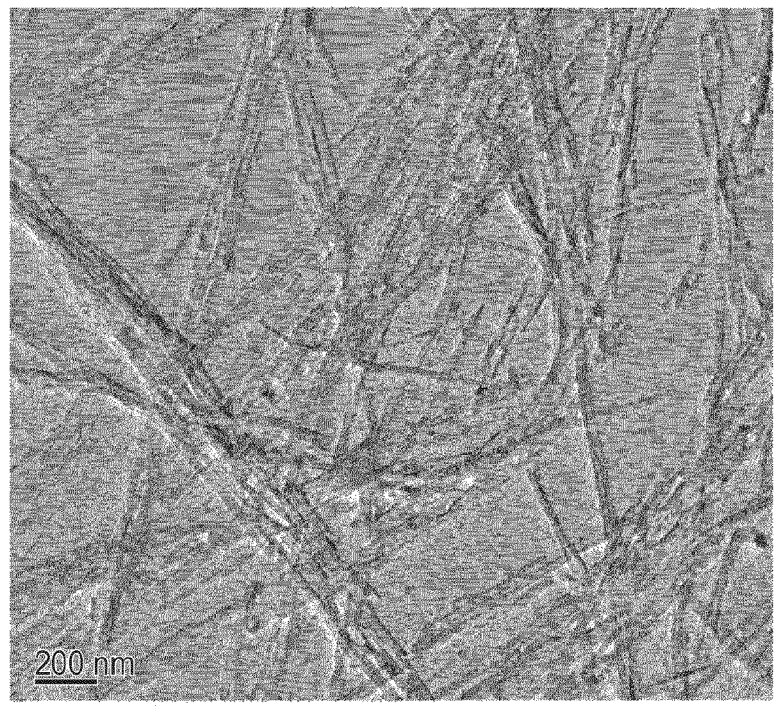
FIG. 3 is a micrograph image of phthalocyanine nanowires magnified with a transmission electron microscope.
Figure 4:
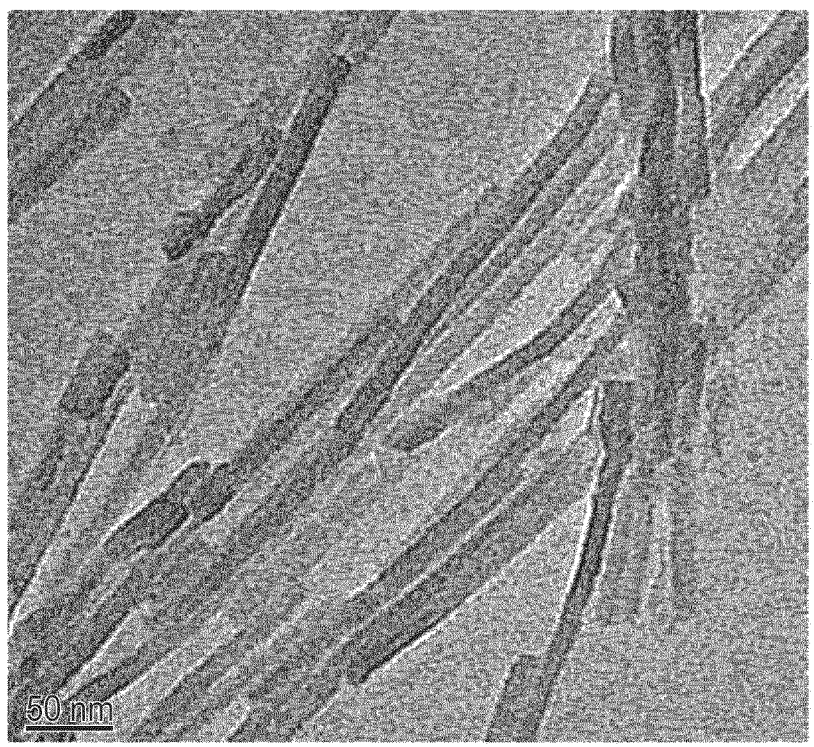
FIG. 4 is a micrograph image of phthalocyanine nanowires magnified with a transmission electron microscope.

The solid content of the thus-obtained dispersion (1) was observed with a transmission electron microscope and was found to have the shape of nanowires whose breadth is about 25 nm and ratio of the length to the breadth is 20 or more (refer to FIGS. 3 and 4). The solid content of the dispersion (1) had a sharp X-ray diffraction peak and hence it was confirmed that the solid content has high crystallinity.

The dispersion (1) (150 mg), 10 mg of PCBM (manufactured by Frontier Carbon Corporation), and 350 mg of ortho-dichlorobenzene were added to a sample vial. This sample vial was subjected to ultrasonic waves for 30 minutes in an ultrasonic cleaner (47 kHz). Thus, a photoelectric conversion device material (1) was obtained.

<Production of Photoelectric Conversion Device>

An ITO transparent conductive layer having a thickness of 100 nm and serving as a positive electrode was deposited on a glass substrate by a sputtering method. The ITO transparent conductive layer was patterned so as to have the shape of a strip having a width of 2 mm by a photolithographic method. The resultant glass substrate having an ITO pattern was subjected to ultrasonic cleanings with a neutral detergent, distilled water, acetone, and ethanol in this order: for each of these solutions, three-time cleanings for 15 minutes. The glass substrate was then subjected to an UV/ozone treatment for 30 minutes. A PEDOT:PSS aqueous dispersion (trade name: AI4083, manufactured by H.C. Starck GmbH) was applied by spin-coating to the ITO pattern to form a buffer layer 1 composed of PEDOT:PSS and having a thickness of 60 nm. The resultant substrate was dried by heating at 100° C. for 5 minutes with a hot plate. The photoelectric conversion layer material (1) was applied by spin-coating to the PEDOT:PSS layer to form an organic semiconductor layer having a thickness of 100 nm and stemming from the photoelectric conversion layer material (1). After that, the "substrate having the organic semiconductor layer" and a metal mask for vapor deposition (for forming a strip pattern having a width of 2 mm) were placed in a vacuum deposition apparatus. After the degree of vacuum in the apparatus was increased to $5\times10^{-4}$ Pa, aluminum was vapor-deposited so as to form a negative electrode having a strip pattern having a width of 2 mm (film thickness: 80 nm) by a resistance heating method. Thus, a photoelectric conversion device (1) having an area of 2 mm×2 mm (region where the strip-shaped ITO layer intersects the strip-shaped aluminum layer) was produced.

Evaluation Example 1

Evaluation of Photoelectric Conversion Device

The positive electrode and negative electrode of the photoelectric conversion device (1) produced in EXAMPLE 1 were connected to a Digital Multimeter (trade name: 6241A, manufactured by ADC CORPORATION). The current of the photoelectric conversion device (1) was measured while voltage was swept from −0.1 V to +0.8 V in the air under irradiation (from ITO-layer side) with artificial sunlight (simple solar simulator XES151S, manufactured by SAN-EI ELECTRIC CO., LTD.; spectrum shape: AM 1.5; intensity: 100 mW/cm$^2$). At this time, the short-circuit current density (current density at an applied voltage of 0 V, hereafter referred to as $J_{sc}$) was 5.17 mA/cm$^2$; the open-circuit voltage (applied voltage at a current density of 0, hereafter referred to as $V_{oc}$) was 0.57 V; the fill factor (FF) was 0.37; and the photoelectric conversion efficiency (PCE) calculated from these values was 1.11%. Note that FF and PCE were calculated with the following formulae.

$$FF=JV_{max}/(J_{sc}\times V_{oc})$$

(where $JV_{max}$ represents the product of current density and applied voltage at the point where the product of current density and applied voltage has the maximum value while the applied voltage is 0 V to the open-circuit voltage.)

$$PCE=[(J_{sc}\times V_{oc}\times FF)/\text{artificial-sunlight intensity (100 mW/cm}^2)]\times 100(\%)$$

Example 2

Production of Photoelectric Conversion Device

The dispersion (1) (180 mg) obtained in EXAMPLE (1) was mixed with 180 mg of ortho-dichlorobenzene to provide a photoelectric conversion device material (2).

A photoelectric conversion device (2) was produced as in EXAMPLE (1) except that the photoelectric conversion device material (2) was used instead of the photoelectric conversion device material (1) to form an organic semiconductor (electron-donating material) layer stemming from the photoelectric conversion device material (2) as in EXAMPLE (1), and an electron-accepting material layer was formed thereon by spin-coating with 2 wt % PCBM-ortho-dichlorobenzene.

Evaluation Example 2

Evaluation of Photoelectric Conversion Device

Evaluation was performed as in EVALUATION EXAMPLE 1 except that the photoelectric conversion device (2) was used instead of the photoelectric conversion device (1). As a result, $J_{sc}$ was 4.98 mA/cm$^2$; $V_{oc}$ was 0.57 V; FF was 0.39; and PCE calculated from these values was 1.11%.

Example 3

Production of Photoelectric Conversion Device

To a mixture of 692 parts by mass of Surfonamine B-200 (trade name, primary-amine-terminated poly(ethylene oxide/propylene oxide)(5/95) copolymer, number-average molecular weight: about 2,000, manufactured by Huntsman Corporation) as a polyethermonoamine, 66 parts by mass of sodium carbonate, and 150 parts by mass of water, 210 parts by mass of copper phthalocyanine sulfonyl chloride (sulfonation degree=1) was added and reaction was allowed to occur at 5° C. to room temperature for 6 hours. The resultant reaction mixture was heated in a vacuum at 90° C. to remove water to provide a copper phthalocyanine sulfamoyl compound represented by the following [Chem. 20].

[Chem. 20]

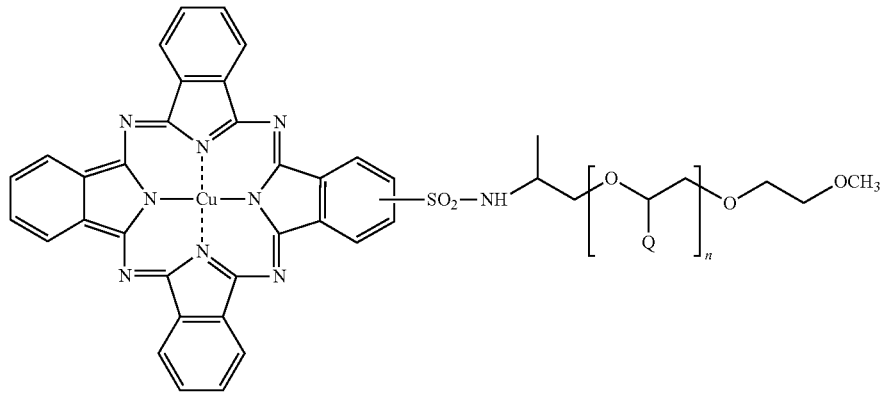

In the compound, Q represents a hydrogen atom or a methyl group; propylene oxide/ethylene oxide=29/6 (molar ratio); average value of n=35.

A photoelectric conversion device material (3) and a photoelectric conversion device (3) were produced as in EXAMPLE 1 except that the compound represented by [Chem. 20] was used instead of the compound represented by [Chem. 9] in EXAMPLE 1.

Evaluation Example 3

Evaluation of Photoelectric Conversion Device

Evaluation was performed as in EVALUATION EXAMPLE 1 except that the photoelectric conversion device (3) was used instead of the photoelectric conversion device (1). As a result, $J_{sc}$ was 2.41 mA/cm$^2$; $V_{oc}$ was 0.50 V; FF was 0.17; and PCE calculated from these values was 0.21%.

Example 4

A photoelectric conversion device material (4) and a photoelectric conversion device (4) were produced as in EXAMPLE 1 except that the compound represented by [Chem. 5] was used instead of the compound represented by [Chem. 9] in EXAMPLE 1.

Evaluation Example 4

Evaluation of Photoelectric Conversion Device

Evaluation was performed as in EVALUATION EXAMPLE 1 except that the photoelectric conversion device (4) was used instead of the photoelectric conversion device (1). As a result, $J_{sc}$ was 0.83 mA/cm$^2$; $V_{oc}$ was 0.48 V; FF was 0.27; and PCE calculated from these values was 0.11%.

Example 5

A photoelectric conversion device material (5) and a photoelectric conversion device (5) were produced as in EXAMPLE 1 except that the compound represented by [Chem. 6] was used instead of the compound represented by [Chem. 9] in EXAMPLE 1.

Evaluation Example 5

Evaluation of Photoelectric Conversion Device

Evaluation was performed as in EVALUATION EXAMPLE 1 except that the photoelectric conversion device (5) was used instead of the photoelectric conversion device (1). As a result, $J_{sc}$ was 1.56 mA/cm$^2$; $V_{oc}$ was 0.42 V; FF was 0.15; and PCE calculated from these values was 0.10%.

Example 6

A photoelectric conversion device material (6) and a photoelectric conversion device (6) were produced as in EXAMPLE 1 except that the compound represented by [Chem. 7] was used instead of the compound represented by [Chem. 9] in EXAMPLE 1.

Evaluation Example 6

Evaluation of Photoelectric Conversion Device

Evaluation was performed as in EVALUATION EXAMPLE 1 except that the photoelectric conversion device (6) was used instead of the photoelectric conversion device (1). As a result, $J_{sc}$ was 2.33 mA/cm$^2$; $V_{oc}$ was 0.52 V; FF was 0.14; and PCE calculated from these values was 0.16%.

Example 7

A photoelectric conversion device material (7) and a photoelectric conversion device (7) were produced as in EXAMPLE 1 except that the compound represented by [Chem. 8] was used instead of the compound represented by [Chem. 9] in EXAMPLE 1.

Evaluation Example 7

Evaluation of Photoelectric Conversion Device

Evaluation was performed as in EVALUATION EXAMPLE 1 except that the photoelectric conversion device (7) was used instead of the photoelectric conversion device (1). As a result, $J_{sc}$ was 3.49 mA/cm$^2$; $V_{oc}$ was 0.51 V; FF was 0.22; and PCE calculated from these values was 0.40%.

Example 8

A photoelectric conversion device material (8) and a photoelectric conversion device (8) were produced as in EXAMPLE 1 except that 10 mg of CNPPV (poly(2,5-di(hexyloxy)-cyanoterephthalydene)(manufactured by Aldrich) was used instead of 10 mg of PCBM (manufactured by Frontier Carbon Corporation) in EXAMPLE 1.

Evaluation Example 8

Evaluation of Photoelectric Conversion Device

Evaluation was performed as in EVALUATION EXAMPLE 1 except that the photoelectric conversion device (8) was used instead of the photoelectric conversion device (1). As a result, $J_{sc}$ was 1.46 mA/cm$^2$; $V_{oc}$ was 0.49 V; FF was 0.13; and PCE calculated from these values was 0.10%.

Comparative Example 1

A photoelectric conversion device was produced as in EXAMPLE (1) except that copper phthalocyanine was used instead of the phthalocyanine nanowires produced in EXAMPLE (1). However, the dispersibility of copper phthalocyanine in the solvent was low and a photoelectric conversion device layer was not formed with this dispersion.

INDUSTRIAL APPLICABILITY

Use of a material for a photoelectric conversion device according to the present invention can provide a photoelectric conversion device having a long life due to high light resistance of phthalocyanine and being produced at a low cost by a wet process. Use of such photoelectric conversion devices can constitute a solar-cell module having a long life and being produced at a low cost due to the feature of the photoelectric conversion devices.

REFERENCE SIGNS LIST 1 substrate
2 electrode a
3 photoelectric conversion layer
4 electrode b
5 layer containing phthalocyanine nanowires according to the present invention (in the case of electrode a being positive electrode) or electron-accepting-material-containing layer (in the case of electrode a being negative electrode)
6 electron-accepting-material-containing layer (in the case of electrode b being negative electrode) or layer containing phthalocyanine nanowires according to the present invention (in the case of electrode b being positive electrode)

The invention claimed is:

1. A material for a photoelectric conversion device, comprising phthalocyanine nanowires having a breadth of 50 nm or less and a ratio (length/breadth) of a length to the breadth, the ratio being 10 or more,
   wherein the phthalocyanine nanowires contain an unsubstituted phthalocyanine and a substituted phthalocyanine.

2. The material for a photoelectric conversion device according to claim 1, wherein the, unsubstituted phthalocyanine is unsubstituted copper phthalocyanine, unsubstituted zinc phthalocyanine, unsubstituted iron phthalocyanine, unsubstituted cobalt phthalocyanine, unsubstituted nickel phthalocyanine, unsubstituted tin phthalocyanine, unsubstituted lead phthalocyanine, unsubstituted magnesium phthalocyanine, unsubstituted silicon phthalocyanine, unsubstituted titanyl phthalocyanine, unsubstituted vanadyl phthalocyanine, unsubstituted aluminum chloride phthalocyanine, or unsubstituted phthalocyanine without having a central metal.

3. The material for a photoelectric conversion device according to claim 1, wherein the substituted phthalocyanine is represented by a general formula (1) or (2)

[Chem. 1]

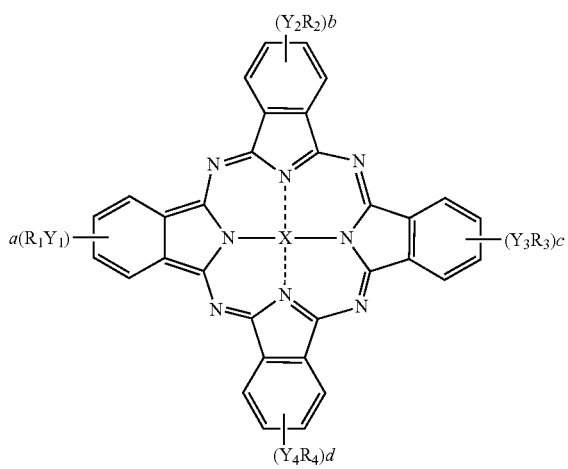

(1)

(2)

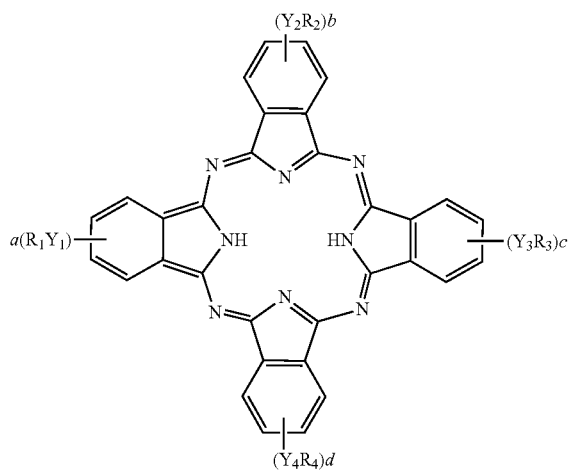

(where X represents any one selected from the group consisting of a copper atom, a zinc atom, a cobalt atom, a nickel atom, a tin atom, a lead atom, a magnesium atom, a silicon atom, and an iron atom; $Y_1$ to $Y_4$ represent bonding groups that bond the phthalocyanine skeletons to $R_1$ to $R_4$;

when $Y_1$ to $Y_4$ serving as bonding groups are not present, $R_1$ to $R_4$ each represent $SO_3H$, $CO_2H$, an alkyl group that may optionally have a substituent, an (oligo)aryl group that may optionally have a substituent, an (oligo)heteroaryl group that may optionally have a substituent, a phthalimide group that may optionally have a substituent, or a fullerene that may optionally have a substituent;

when $Y_1$ to $Y_4$ each represent a bonding group of —$(CH_2)_n$— (n represents an integer of 1 to 10), —CH=CH—, —C≡C—, —O—, —NH—, —S—, —S(O)—, or —$S(O)_2$—, $R_1$ to $R_4$ each represent an alkyl group that may optionally have a substituent, an (oligo)aryl group that may optionally have a substituent, an (oligo)heteroaryl group that may optionally have a substituent, a phthalimide group that may optionally have a substituent, or a fullerene that may optionally have a substituent; and a, b, c, and d each independently represent an integer of 0 to 4 and at least one of a to d is not zero.).

4. The material for a photoelectric conversion device according to claim 3, wherein the alkyl group that may optionally have a substituent is a methyl group, an ethyl group, or a propyl group; the (oligo)aryl group that may optionally have a substituent is an (oligo)phenylene group that may optionally have a substituent or an (oligo)naphthylene group that may optionally have a substituent; and the (oligo)heteroaryl group that may optionally have a substituent is an (oligo)pyrrole group that may optionally have a substituent, an (oligo)thiophene group that may optionally have a substituent, an (oligo)benzopyrrole group that may optionally have a substituent, or an (oligo)benzothiophene group that may optionally have a substituent.

5. The material for a photoelectric conversion device according to claim 1, wherein the substituted phthalocyanine is represented by a general formula (3)

[Chem. 2]

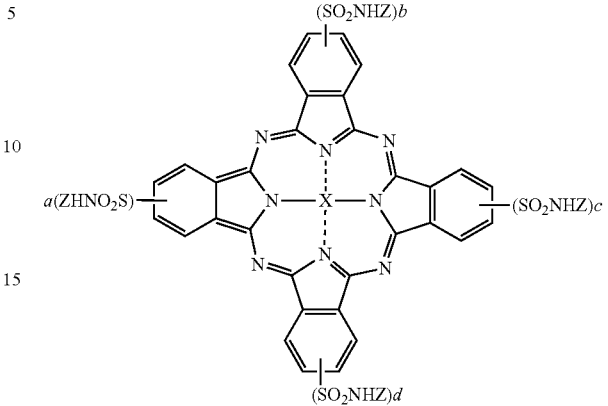

(3)

(where X represents any one selected from the group consisting of a copper atom, a zinc atom, a cobalt atom, a nickel atom, a tin atom, a lead atom, a magnesium atom, a silicon atom, and an iron atom; Z represents a group represented by a formula (a) or (b) below; and a, b, c, and d each independently represent an integer of 0 to 4 and at least one of a to d is not zero.)

[Chem. 3]

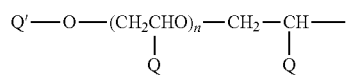

(a)

(where n represents an integer of 4 to 100; Q each independently represents a hydrogen atom or a methyl group; and Q' represents an acyclic hydrocarbon group having 1 to 30 carbon atoms.)

[Chem. 4]

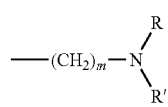

(b)

(where m represents an integer of 1 to 20; and R and R' each independently represent an alkyl group having 1 to 20 carbon atoms.).

6. The material for a photoelectric conversion device according to claim 1, further comprising an electron-accepting material.

7. The material for a photoelectric conversion device according to claim 6, wherein the electron-accepting material is a fullerene.

8. The material for a photoelectric conversion device according to claim 6, wherein the electron-accepting material is an electron-accepting polymer.

9. The material for a photoelectric conversion device according to claim 6, wherein the electron-accepting material is a perylene.

10. A photoelectric conversion device comprising a positive electrode, a negative electrode, and the material for a photoelectric conversion device according to claim 1, the material being between the positive electrode and the negative electrode.

11. A photoelectric conversion device comprising a positive electrode, a negative electrode, and the material for a photoelectric conversion device according to claim 2, the material being between the positive electrode and the negative electrode.

12. A photoelectric conversion device comprising a positive electrode, a negative electrode, and the material for a photoelectric conversion device according to claim 3, the material being between the positive electrode and the negative electrode.

13. A photoelectric conversion device comprising a positive electrode, a negative electrode, and the material for a photoelectric conversion device according to claim 4, the material being between the positive electrode and the negative electrode.

14. A photoelectric conversion device comprising a positive electrode, a negative electrode, and the material for a photoelectric conversion device according to claim 5, the material being between the positive electrode and the negative electrode.

15. A photoelectric conversion device comprising a positive electrode, a negative electrode, and the material for a photoelectric conversion device according to claim 6, the material being between the positive electrode and the negative electrode.

16. A photoelectric conversion device comprising a positive electrode, a negative electrode, and the material for a photoelectric conversion device according to claim 7, the material being between the positive electrode and the negative electrode.

17. A photoelectric conversion device comprising a positive electrode, a negative electrode, and the material for a photoelectric conversion device according to claim 8, the material being between the positive electrode and the negative electrode.

18. A photoelectric conversion device comprising a positive electrode, a negative electrode, and the material for a photoelectric conversion device according to claim 9, the material being between the positive electrode and the negative electrode.

19. The material for a photoelectric conversion device according to claim 2, further comprising an electron-accepting material.

20. The material for a photoelectric conversion device according to claim 3, further comprising an electron-accepting material.

* * * * *